(12) United States Patent
Ogura et al.

(10) Patent No.: US 7,199,426 B2
(45) Date of Patent: Apr. 3, 2007

(54) NONVOLATILE SEMICONDUCTOR MEMORY DEVICE AND METHOD FOR FABRICATING THE SAME

(75) Inventors: Jusuke Ogura, Kawasaki (JP); Hiroyuki Ogawa, Kawasaki (JP); Tatsuo Chijimatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/076,063

(22) Filed: Mar. 10, 2005

(65) Prior Publication Data

US 2006/0081915 A1 Apr. 20, 2006

(30) Foreign Application Priority Data

Oct. 19, 2004 (JP) ............................. 2004-304595

(51) Int. Cl.
*H01L 29/72* (2006.01)
(52) U.S. Cl. ............ 257/321; 257/331; 257/341; 257/390; 257/401
(58) Field of Classification Search ................ 257/321, 257/331, 341, 390, 401
See application file for complete search history.

(56) References Cited

U.S. PATENT DOCUMENTS

| | | | |
|---|---|---|---|
| 5,966,603 A | 10/1999 | Eitan | |
| 6,201,267 B1* | 3/2001 | Gupta et al. | ............... 257/206 |
| 6,215,148 B1 | 4/2001 | Eitan | |
| 6,297,096 B1 | 10/2001 | Boaz | |
| 6,468,865 B1 | 10/2002 | Yang et al. | |
| 6,541,816 B2 | 4/2003 | Ramsbey et al. | |
| 2003/0011007 A1 | 1/2003 | Takashino | |
| 2003/0161192 A1* | 8/2003 | Kobayashi et al. | ......... 365/200 |

FOREIGN PATENT DOCUMENTS

| | | |
|---|---|---|
| EP | 05004473 | 3/2006 |
| JP | 2002-541665 | 12/2002 |
| WO | WO00/60665 | 10/2000 |
| WO | WO 00/60665 | 10/2000 |

OTHER PUBLICATIONS

European Search Report dated Mar. 6, 2006.
Ilan Bloom et al., "NROM™ NVM technology for Multi-Media Applications", 2003, NVSMW.

* cited by examiner

*Primary Examiner*—Edward Wojciechowicz
(74) *Attorney, Agent, or Firm*—Westerman, Hattori, Daniels & Adrian, LLP

(57) ABSTRACT

The nonvolatile semiconductor memory device comprises a channel region formed in a semiconductor substrate, a gate electrode formed over the channel region with a charge retaining insulating film interposed therebetween, a first pair of source/drain regions arranged in a first direction with the channel region formed therebetween, and a second pair of source/drain regions arranged in a second direction intersecting the first direction with the channel region formed therebetween. The channel region and the gate electrode are common between a first memory cell transistor including the first pair of source/drain regions and a second memory cell transistor including the second pair of source/drain regions.

9 Claims, 38 Drawing Sheets

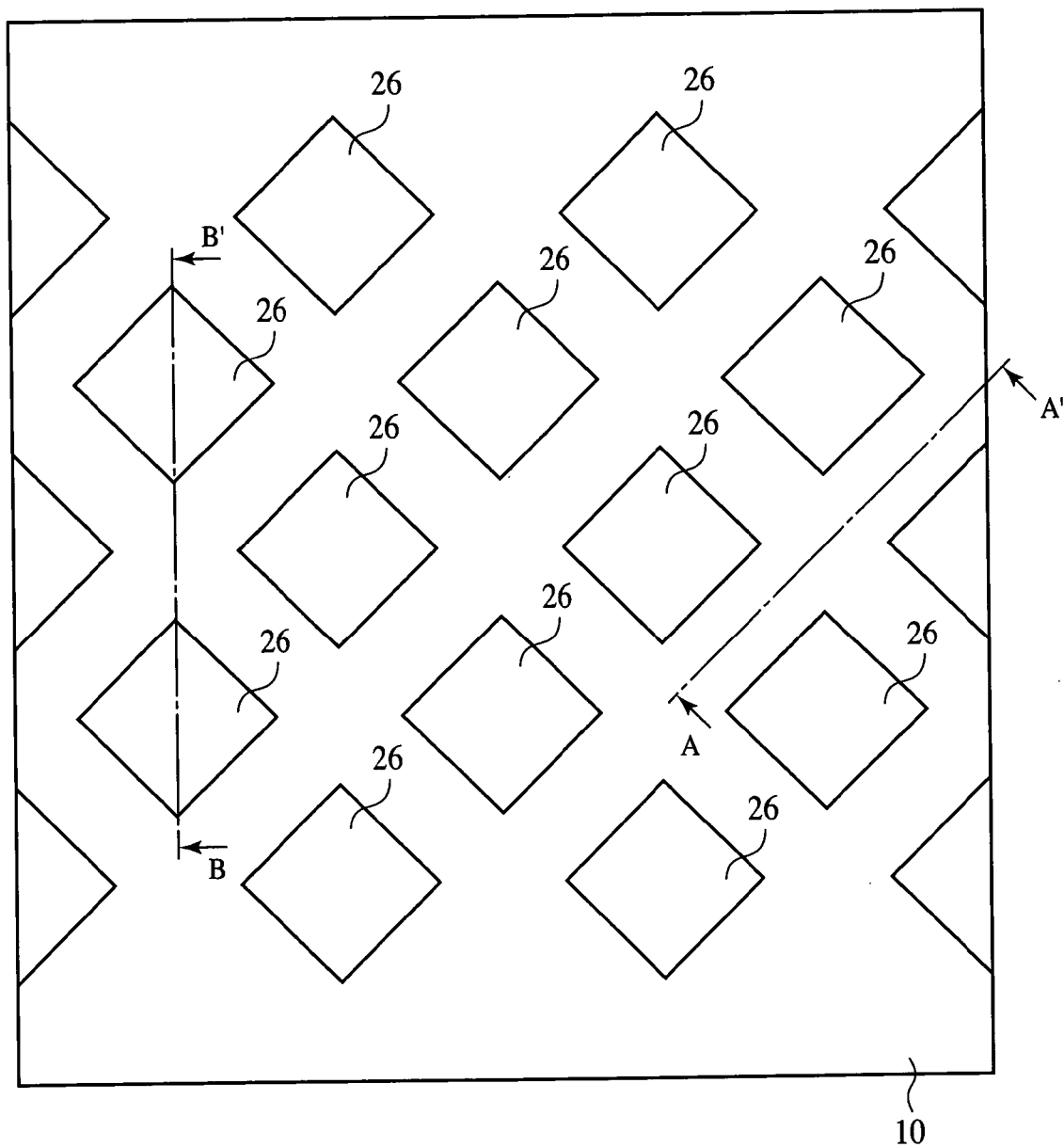

NONVOLATILE SEMICONDUCTOR MEMORY DEVICE AND METHOD FOR FABRICATING THE SAME

CROSS-REFERENCE TO RELATED APPLICATIONS

This application is based upon and claims the benefit of priority from the prior Japanese Patent Application No. 2004-304595, filed on Oct. 19, 2004, the entire contents of which are incorporated herein by reference.

BACKGROUND OF THE INVENTION

The present invention relates to a nonvolatile semiconductor memory device and a method for fabricating the same, more specifically a nonvolatile semiconductor memory device including nonvolatile memory cells of the SONOS (Silicon Oxide Nitride Oxide Silicon) structure and a method for fabricating the same.

As rewritable nonvolatile semiconductor memory devices are generally known EEPROM, flash EEPROM, etc., which store charges in the floating gate to thereby memorize information. These nonvolatile semiconductor memory devices, which include control gate functioning as word line and floating gate for memorizing information, require two conducting layers to form the memory cell transistors. On the other hand, as a structure which is simpler and easier to be highly integrated is proposed a nonvolatile semiconductor memory device which uses a dielectric film as the charge storage layer to form the memory cell transistors having single-layer gate.

As the nonvolatile semiconductor memory device having the single-layer gate, the nonvolatile semiconductor memory device of the structure called SONOS (Silicon Oxide Nitride Oxide Silicon) is developed. In the nonvolatile semiconductor memory device using the SONOS technique, e.g., the ONO structure of $SiO_2/SiN/SiO_2$ is used as the charge storage layer, and charges are retained in the defects in the SiN to thereby memorize information. For higher integration and further cost reduction, a 2-bit operative nonvolatile semiconductor memory device which can retain charges locally in the source ends and the drain ends is developed.

Such 2-bit operative nonvolatile semiconductor memory device has a merit that with the same cell numbers, the storage memory number is simply twice and a merit that with the same storage memory numbers, the chip area can be simply reduced in half, and is a very prospective device which can simultaneously satisfy the requirements of high integration and cost reduction.

The nonvolatile semiconductor memory device using the SONOS technique is described in, e.g., Reference 1 (U.S. Pat. No. 5,966,603), Reference 2 (U.S. Pat. No. 6,215,148), Reference 3 (U.S. Pat. No. 6,297,096), Reference 4 (U.S. Pat. No. 6,468,865), Reference 5 (U.S. Pat. No. 6,541,816), and Reference 6 (Japanese published unexamined patent application No. 2002-541665).

In the nonvolatile semiconductor memory device described in References 1 to 3, after the charge retaining insulating film (ONO film) is grown, the bit lines in the memory cell array are patterned by using a mask of photoresist or others, and after the ON film which is the upper part of the charge retaining insulating film is etched, ion implantation for the bit lines is performed. In the nonvolatile semiconductor memory device described in Reference 2, after these steps, with the same mask, pocket ion implantation is performed, and then after the mask is removed the bit line oxidation film is grown, and a polycrystalline silicon film, etc. to be the word lines is grown.

In the nonvolatile semiconductor memory device described in Reference 4, after the charge retaining insulating film is grown, the bit lines in the memory cell array are patterned with a mask of photoresist film or others, and then after the ion implantation for the bit lines is performed, the charge retaining insulating film on the bit lines is removed, the bit line oxidation film is formed, and a polycrystalline silicon film, etc. to be the word lines is grown.

In the nonvolatile semiconductor memory device described in Patent Reference 5, after the charge retaining insulating film is grown, the bit lines in the memory cell array are patterned with a mask of photoresist film or others, and then after ion implantation for the bit lines is performed, a polycrystalline silicon film, etc. to be the word lines is grown.

SUMMARY OF THE INVENTION

In the fabricating the memory cells of the nonvolatile semiconductor memory devices described in References 1 to 5, fabrication methods using a virtual ground array are used. Accordingly, the bit lines of References 1 to 5 are formed by utilizing a diffused layer formed, buried in the silicon substrate before the word lines are formed, which makes it difficult for the devices to operate at high speed.

To lower the resistance value of the bit lines, 1) the method of exposing the surfaces of the bit lines and siliciding the surfaces; 2) the method of forming the interconnection layers having the same pattern as the bit lines and contacting with the bit lines formed in the substrate at a small gap; 3) the method of burying a metal interconnection material in the center of the bit lines centered; and other methods are considered.

However, to use the methods 1) and 2), the word line interval must be made large, and the memory cell size becomes the larger.

In the method 1), all the regions between the word lines cannot be silicided for the prevention of the short circuit between the bit lines. Siliciding only the tops of the bit lines makes the fabrication process too complicated and difficult to make the fabrication process realistic.

In the method 2), it is most effective for making the bit lines less resistive to ensure the contact with the bit lines at intervals of the word lines, but to this end, the word line interval must be large. In the case that the contacts are formed at intervals of several word lines, the resistance value of the bit lines differs between the cell remotest from a contact and cell nearest to the contact, and an allowance for the transistor operation must be ensured by design. This makes the allowance for the design small.

In the method 3), the bit lines containing metal takes place in the earlier half of the bulk processing, and various thermal processing must be made later. Accordingly, metal contamination of the silicon substrate, etc. due to thermal diffusion of metal and the degradation of the film quality due to the metal contamination can be easily considered, and the method is unrealistic.

The typical virtual ground array structure is described in Reference 7 (Ilan Bloom et al., "NROM™ NVM Technology for Multi-Media Applications", 2003 NVSMW). In using the virtual ground array, the bit lines are formed of a diffused layer in a relatively early step, and the diffused layer is extended into the channel-wise by the thermal history given by the later fabrication steps, with the result that the effective channel length becomes shorter than the designed channel length. This means that the channel-wise downsizing is very difficult, and it is not easy to make the unit cell area per 1 bit small.

As described above, the conventional nonvolatile semiconductor memory devices have found it difficult to satisfy simultaneously the two requirements of higher speed and higher integration by using the SONOS technique and the virtual ground array technique.

An object of the present invention is to provide a structure of the nonvolatile semiconductor memory device including nonvolatile memory cells of the SONOS structure, which can realize simultaneously two requirements of high speed and high integration, and a method for fabricating the same.

According to one aspect of the present invention, there is provided a nonvolatile semiconductor memory device comprising: a channel region formed in a semiconductor substrate; a gate electrode formed over the channel region with a charge retaining insulating film interposed therebetween; and a plurality of pairs of source/drain regions formed in the semiconductor substrate, each pair of the source/drain regions being arranged with the channel region formed therebetween.

According to another aspect of the present invention, there is provided a nonvolatile semiconductor memory device comprising: a channel region formed in a semiconductor substrate; a gate electrode form over the channel region with a charge retaining insulating film formed therebetween; a first pair of source/drain regions formed in the semiconductor substrate and arranged in a first direction with the channel region formed therebetween; and a second pair of source/drain regions formed in the semiconductor substrate and arranged in a second direction intersecting the first direction with the channel region formed therebetween, the channel region and the gate electrode being common between a first memory cell transistor including the first pair of source/drain regions and a second memory cell transistor including the second pair of source/drain regions.

According to further another aspect of the present invention, there is provided a nonvolatile semiconductor memory device comprising: an active region defined in a lattice pattern by a plurality of device isolation regions formed in a semiconductor substrate; a plurality of channel regions provided at every lattice points but one of the lattice pattern of the active region; a plurality of source/drain regions formed at every lattice points but one which are other than the lattice points where the channel regions are formed; and a plurality of gate electrodes formed respectively over said plurality of channel regions with a charge retaining insulating film formed therebetween, at each of the lattice points where the channel regions are formed, a first memory cell transistor including a pair of said source/drain regions arranged in a first direction with the channel region formed therebetween, and a second memory cell transistor including a pair of said source/drain regions arranged in a second direction intersecting the first direction with the channel region formed therebetween.

According to further another aspect of the present invention, there is provided a method for fabricating a nonvolatile semiconductor memory device comprising: an active region of a lattice pattern defined by a plurality of device isolation regions formed in a semiconductor substrate; a plurality of channel regions formed at every lattice points but one of the lattice pattern of the active region; a plurality of source/drain regions formed at every lattice points but one which are other than the lattice points where the channel regions are formed; and a plurality of gate electrodes formed over the respective channel regions with a charge retaining insulating film formed therebetween, a first memory cell transistor including the pair of source/drain regions arranged in a first direction with the channel region formed therebetween and a second memory cell transistor including the pair of source/drain region arranged in a second direction intersecting the first direction with the channel region formed therebetween being formed at each of the lattice points where the channel regions are formed, a total overlay between the gate electrode and the device isolation region in a third direction which is one diagonal direction of the lattice pattern being defined by a minimum overlay in the third direction necessary between the gate electrode and the device isolation region, a fluctuation of a size of the device isolation region estimated in the third direction, and a fluctuation of a size of the gate electrode estimated in the third direction, and a total overlay between the gate electrode and the device isolation region in a fourth direction which is the other diagonal direction of the lattice pattern is defined by a minimum overlay in the fourth direction necessary between the gate electrode and the device isolation region, a fluctuation of a size of the device isolation region estimated in the fourth direction, and a fluctuation of a size of the gate electrode estimated in the fourth direction.

According to the present invention, one channel region is common between 2 or more memory cell transistors, whereby 1 unit memory cell can store charges for 4 bits or more, and the integration can be improved. Such cell structure can much reduce the cell area per the unit bit, whereby the cell area increase by providing bit line contacts for the respective source/drain regions can be generally suppressed. Accordingly, the cell area increase can be suppressed while the bit lines can be formed of a metal interconnection layer, whereby high speed operation can be realized.

BRIEF DESCRIPTION OF THE DRAWINGS

FIGS. 12, 13, 15, 17, 20, 22, 24, 26, 29, 31, 33 and 35 are plan views of the nonvolatile semiconductor memory device, which show the method for fabricating the nonvolatile semiconductor memory device according to the embodiment of the present invention.

DETAILED DESCRIPTION OF THE INVENTION

[Embodiment]

The nonvolatile semiconductor memory device and the method for fabricating the same according to one embodiment of the present invention will be explained with reference to FIGS. 1 to 36.

Figure 1:
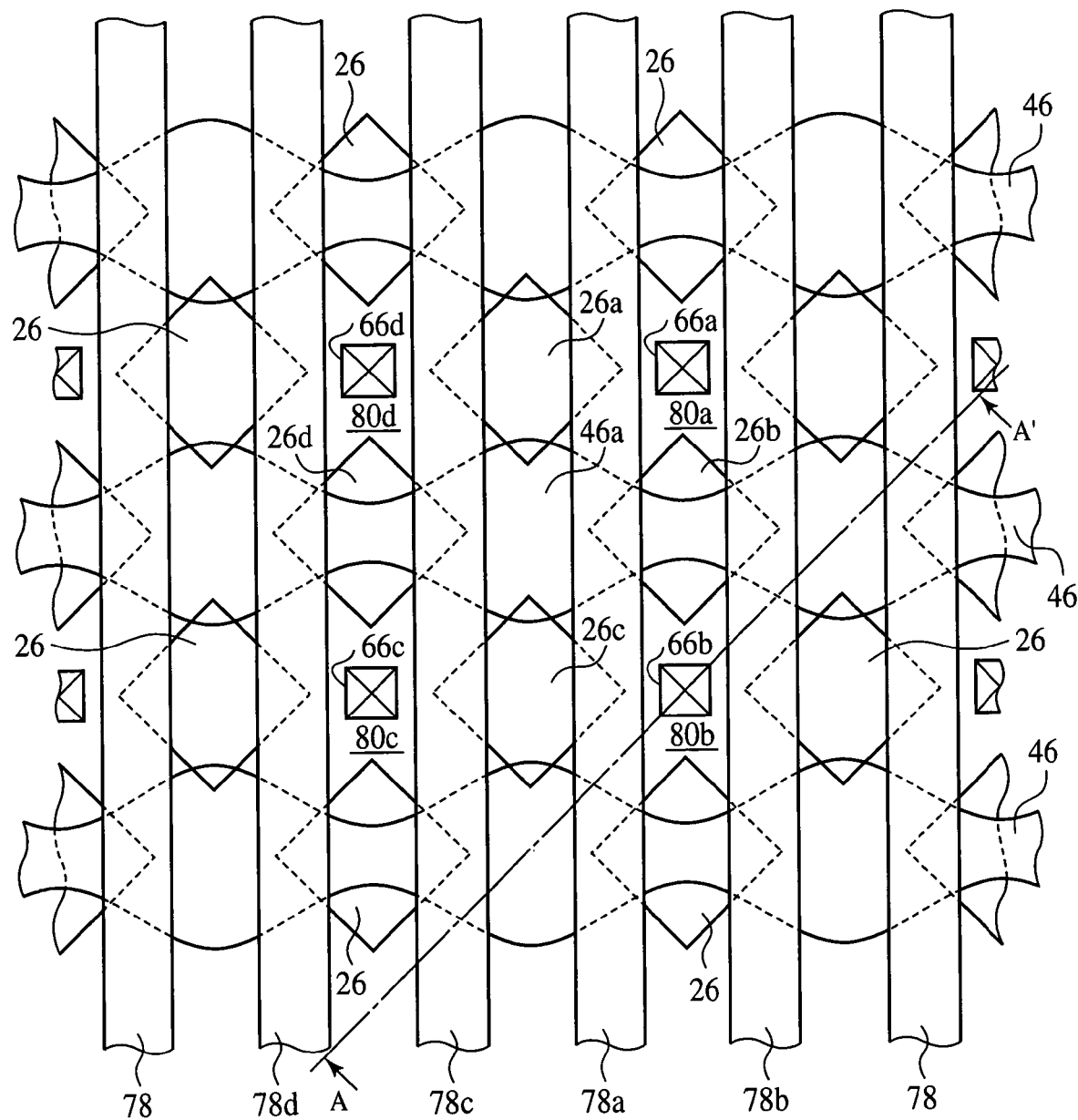
FIG. 1 is a plan view of the nonvolatile semiconductor memory device according to one embodiment of the present invention, which shows a structure thereof.
Figure 2:
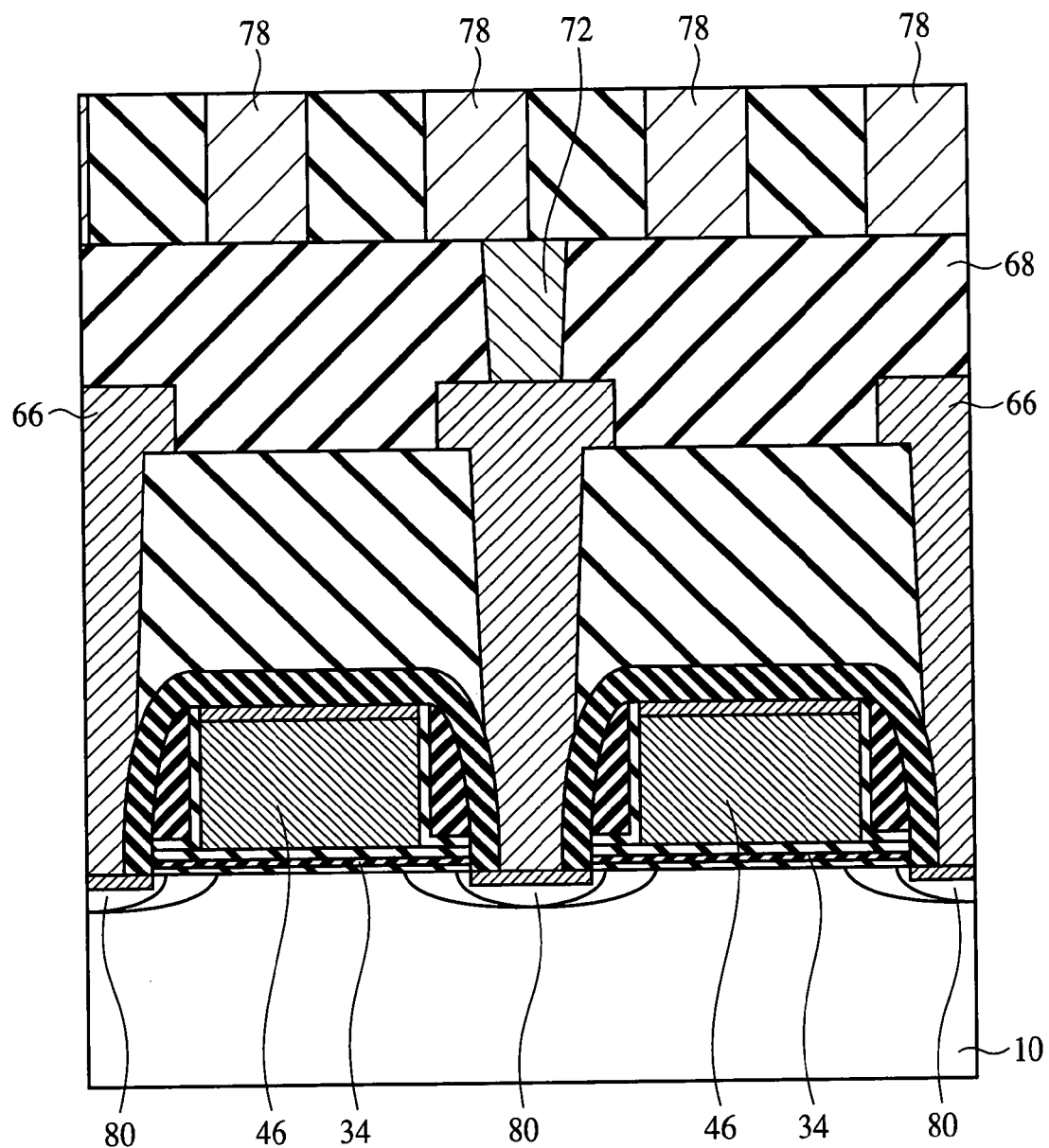
FIG. 2 is a diagrammatic sectional view of the nonvolatile semiconductor memory device according to the embodiment of the present invention, which shows the structure thereof.
Figure 3:
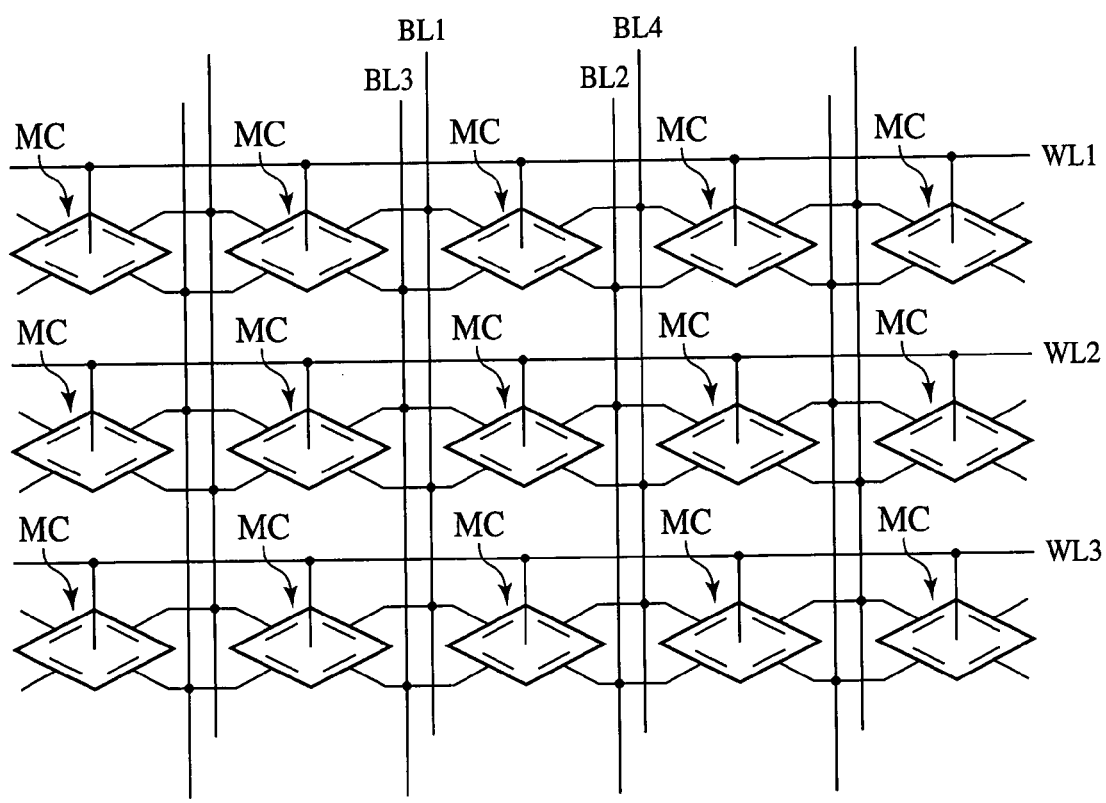
FIG. 3 is a circuit diagram of the nonvolatile semiconductor memory device according to the embodiment of the present invention, which shows the structure thereof.

FIG. 1 is a plan view of the nonvolatile semiconductor memory device according to the present embodiment, which shows a structure thereof. FIG. 2 is a diagrammatic sectional view of the nonvolatile semiconductor memory device according to the present embodiment, which shows the structure thereof. FIG. 3 is a circuit diagram of the nonvolatile semiconductor memory device according to the present embodiment, which shows the structure thereof. FIGS. 4–11 are plan views explaining a method for laying out the memory cells of the nonvolatile semiconductor memory device according to the present embodiment. FIGS. 12, 13, 15, 17, 20, 22, 24, 26, 29, 31, 33 and 35 are plan views of the nonvolatile semiconductor memory device, which show the method for fabricating the nonvolatile semiconductor memory device according to the present embodiment. FIGS. 14A–14B, 16A–16B, 18A–18B, 19A–19B, 21A–21B, 23A–23B, 25A–25B, 27A–27B, 28A–28C, 30A–30B, 32A–32B, 34 and 36 are sectional views of the nonvolatile semiconductor memory device in the steps of the method for fabricating the nonvolatile semiconductor memory device according to the present embodiment, which show the method.

First, the structure of the nonvolatile semiconductor memory device according to the present embodiment will be explained with reference to FIGS. 1 to 3.

A device isolation film 26 for defining active regions is buried in the primary surface of a silicon substrate 10. As shown in FIG. 1, the device isolation film 26 has a rectangular unit pattern, and the unit patterns are laid out in a matrix. As viewed from the side of the active regions, it may be considered as a lattice pattern formed of stripes patterns extended in a first direction and stripe patterns extended in a second direction intersecting the first direction.

On the silicon substrate 10 with the device isolation film 26 formed in, word lines 46 are formed with a charge retaining insulating film 34 of ONO film interposed therebetween. The word lines 46 are formed, extended over every active regions but one which are each enclosed by 4 adjacent unit patterns of the device isolation film 26 and intersecting the diagonal direction of the rectangular unit patterns of the device isolation film 26.

In those of the active regions in the silicon substrate 10, where the word lines 46 are not extended, source/drain regions 80 are formed.

On the silicon substrate 10 with source/drain diffused layers 80 and the word lines 46 formed on, bit lines 78 electrically connected to the source/drain regions 80 via contact holes 66, etc are formed.

When the active region enclosed by the device isolation films 26a, 26b, 26c, 26d is noted, a control gate 46a which is a part of the word line 46 is formed over this region. The control gate 46a is formed, extended above the device isolation films 26a, 26b, 26c, 26d. Source/drain regions 80a, 80b, 80c, 80d are separated from one another by the device isolation films 26a, 26b, 26c, 26d of the device isolation film and the word line 46.

Thus, in the part enclosed by the device isolation film 26a, 26b, 26c, 26d, a first memory cell transistor of the SONOS structure including the control gate 46a and a pair of the opposed source/drain regions 80a, 80c, and a second memory cell transistor of the SONOS structure including the control gate 46a and a pair of the opposed source/drain regions 80b, 80d are formed. The path of the channel current in the first memory cell transistor and the path of the channel current in the second memory cell transistor are normal to each other, which causes no problem in the operation of both transistors. The source/drain regions 80a, 80b, 80c, 80d are electrically connected respectively to the bit lines 78a, 78b, 78c, 78d.

FIG. 3 is a circuit diagram of the nonvolatile semiconductor memory device according to the present embodiment. In the circuit diagram of FIG. 3, the rhombic parts are memory cells MC. Each memory cell MC is connected to 1 word line WL and 4 bit lines BL.

When the memory cells MC at the center of FIG. 3 are noted, the control gate 46 in FIG. 1 corresponds to the word line WL2, and the bit lines 78a, 78b, 78c, 78d correspond respectively to the bit lines BL2, BL4, BL1, BL3.

When the first memory cell transistors are operated, the word line WL2 and the bit lines BL1, BL2 are used. With a prescribed voltage being applied to the word line WL2, a prescribed voltage is applied between the bit lines BL1, BL2 to flow channel current, whereby charges can be stored in the charge retaining insulating film 34. The direction of the voltage applied between the bit lines BL1, BL2 is suitably changed, whereby the charge retaining insulating film 34 on the side of the source/drain region 80a and the charge retaining insulating film 34 on the side of the source/drain region 80c can memorize information independently of each other.

When the second memory cell transistors are operated, the word line WL2 and the bit lines BL3, BL4 are used. With a prescribed voltage being applied to the word line WL2, a prescribed voltage is applied between the bit lines BL3 and BL4 to flow channel current, whereby charges can be stored in the charge retaining insulating film 34. The direction of the voltage applied between the bit lines BL3, BL4 is suitably changed, whereby the charge retaining insulating film 34 on the side of the source/drain region 80b and the charge retaining insulating film 34 on the side of the source/drain region 80d can memorize information independently of each other.

As described above, in the nonvolatile semiconductor memory device according to the present embodiment, 1 source/drain region 80 is common among 4 adjacent memory cells. One channel region (e.g., the active region of the part enclosed by the device isolation films 26a, 26b, 26c, 26d) is common between 2 memory cell transistors. The memory cells are thus arranged, whereby 1 unit memory cell can store charges for 4 bits, and the integration can be improved.

The memory cells are thus arranged, whereby the cell area per a unit bit can be drastically reduced, and the cell area increase by providing the bit line contact holes in the respective source/drain regions can be suppressed as a whole. Accordingly, this allows the bit lines to be formed of a metal interconnection layer while the cell area increase is suppressed, whereby high-speed operation can be realized.

By using the cell layout of the nonvolatile semiconductor memory device according to the present embodiment and with the processing technique of the 248 nm-DUV photoresist generation, the unit area per 1 bit can be integrated up to about 0.031 μm²/bit while a channel length sufficient for the device operation is ensured. With the processing technique of the 193 nm-DUV photoresist generation, in computation, the unit area per 1 bit can be integrated up to about 0.018 μm²/bit.

Next, the method for laying out the memory cells suitably for the nonvolatile semiconductor memory device according to the present embodiment will be explained with reference to FIGS. 4 to 11. In the following description, a channel length of the memory cell transistor is represented by L, and a channel width is represented by W. The channel length L and the channel width W are predetermined, and the relationship of L>W is present. In the specification of the present application, the rhombus means a parallelogram having 4 equal sides and includes square.

Figure 4:
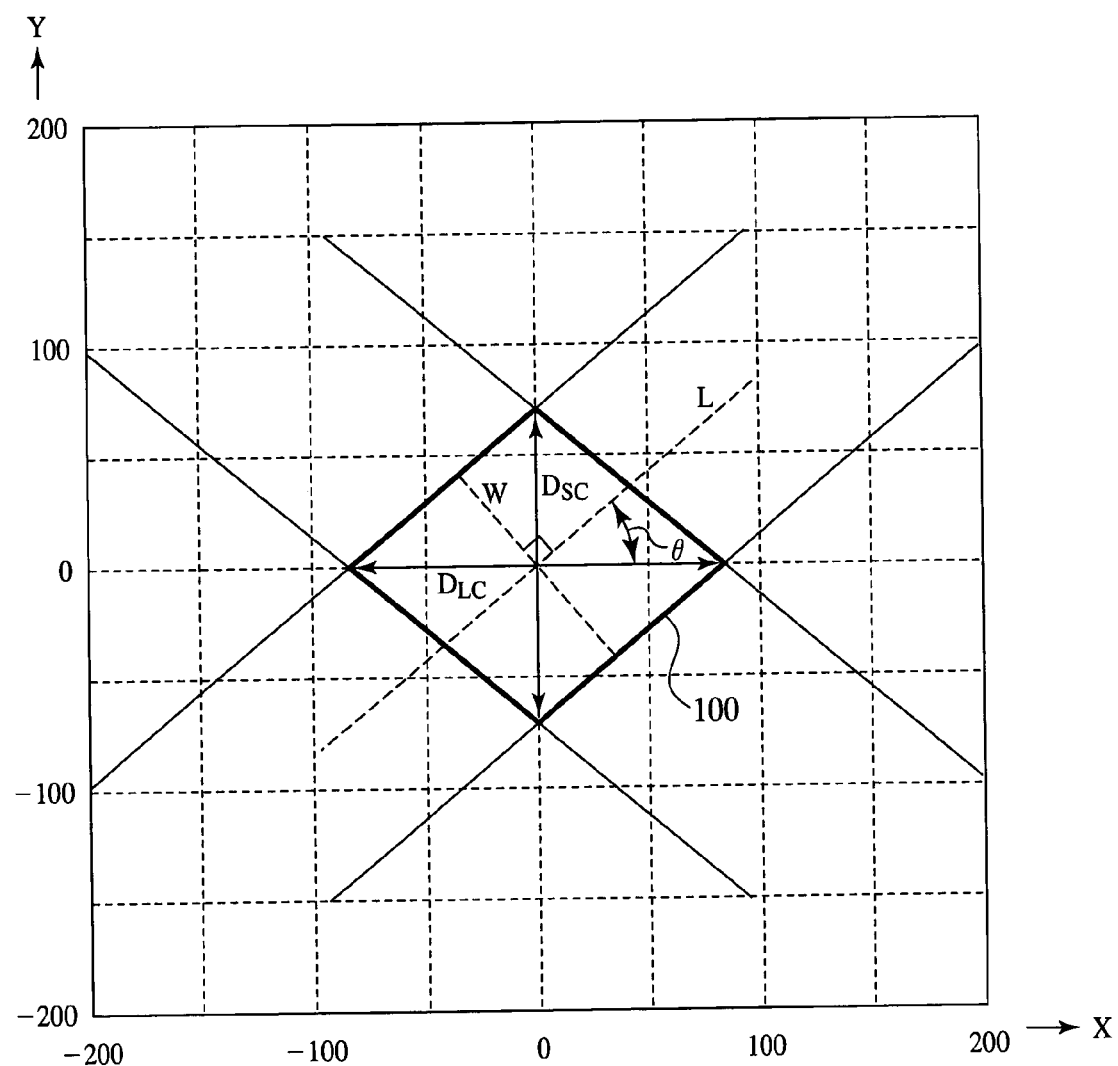
FIGS. 4–11 are plan views explaining a method for laying out the memory cells of the nonvolatile semiconductor memory device according to the embodiment of the present invention.

A coordinate system having the intersection between the center lines of the channels of 2 memory cell transistors as the origin is assumed. As shown in FIG. 4, a channel region 100 which is common between the 2 memory cell transistors is assumed. A length of the X-axial diagonal of the rhombus is represented by $D_{LC}$, a length of the Y-axial diagonal of the rhombus is represented by $D_{SC}$, and a rotation angle of the channel to the X axis is represented by θ (0<θ<90°). At this time, the following relational expression holds between the rotation angle θ and the diagonal lengths $D_{LC}$, $D_{SC}$.

$$\tan\theta = \frac{D_{SC}}{D_{LC}}$$

The diagonal lengths $D_{LC}$, $D_{SC}$ of the rhombus of the channel region 100 can be also defined by the channel width W and the rotation angle θ. That is, with the direction of the channel width being always perpendicular to the direction of the channel length, the channel width W and the diagonal lengths $D_{LC}$, $D_{SC}$ are expressed by the following expression.

$$D_{SC} = \frac{W}{\cos\theta}, \quad D_{LC} = \frac{W}{\sin\theta}$$

The rhombus the layout of the active region is based on has the same shape as the rhombus the formation of the control gate is based on. The relationship between the control gate and the device isolation regions is restricted by an overlay. The overlay means here the overlay of the patterns and the length of the overlay. The overlay is ensured so as to ensure the alignment allowance in lithography and to remove the influences due to the fluctuations, etc. in processing.

Figure 5:
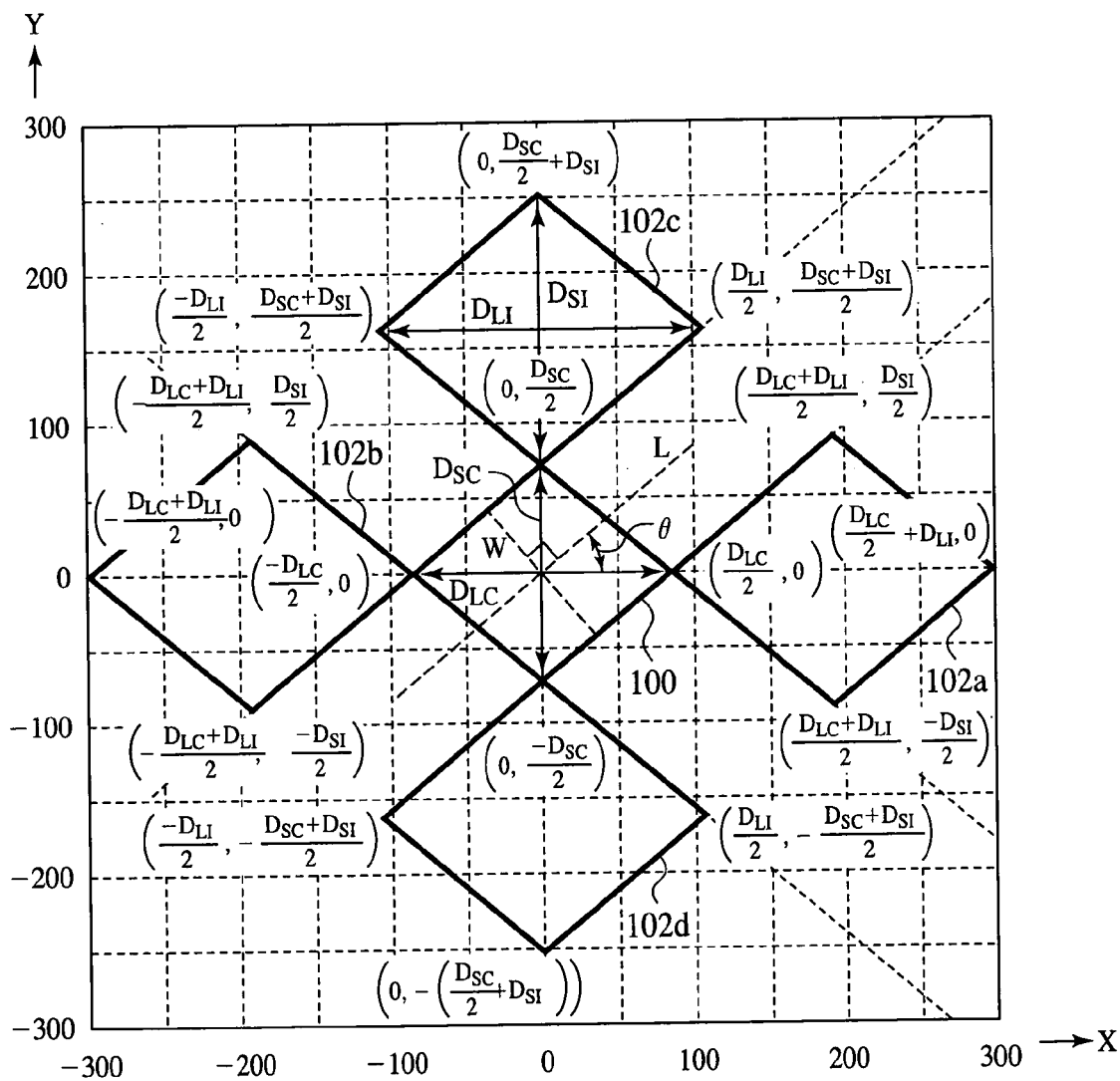

As shown in FIG. 5, the shapes of the device isolation regions 102 is a rhombus which is analogous to the rhombus defined in the region where the channels overlap each other so as to keep the channel width W constant along with channel length. That is, when the Y-axial diagonal length of the device isolation region 102 is represented by $D_{SI}$, and the X-axial diagonal length thereof is represented by $D_{LI}$, the coordinates of the summits of the device isolation regions 102a, 102b which are adjacent to each other in the X-axial direction with respect to the channel region 100 are expressed by $$\left(\pm\frac{D_{LC}}{2}, 0\right), \quad \left(\pm\frac{D_{LC}+D_{LI}}{2}, \frac{D_{SI}}{2}\right), \quad \left(\pm\left(\frac{D_{LC}}{2}+D_{LI}\right), 0\right),$$
$$\left(\pm\frac{D_{LC}+D_{LI}}{2}, -\frac{D_{SI}}{2}\right),$$

and the coordinates of the summits of the device isolation regions 102c, 102d which are adjacent to each other in the Y-axial direction with respect to the channel region 100 are expressed by $$\left(0, \pm\frac{D_{SC}}{2}\right), \quad \left(\frac{D_{LI}}{2}, \pm\frac{D_{SC}+D_{SI}}{2}\right), \quad \left(0, \pm\left(\frac{D_{SC}}{2}+D_{SI}\right)\right),$$
$$\left(-\frac{D_{LI}}{2}, \pm\frac{D_{SC}+D_{SI}}{2}\right).$$

Figure 6:
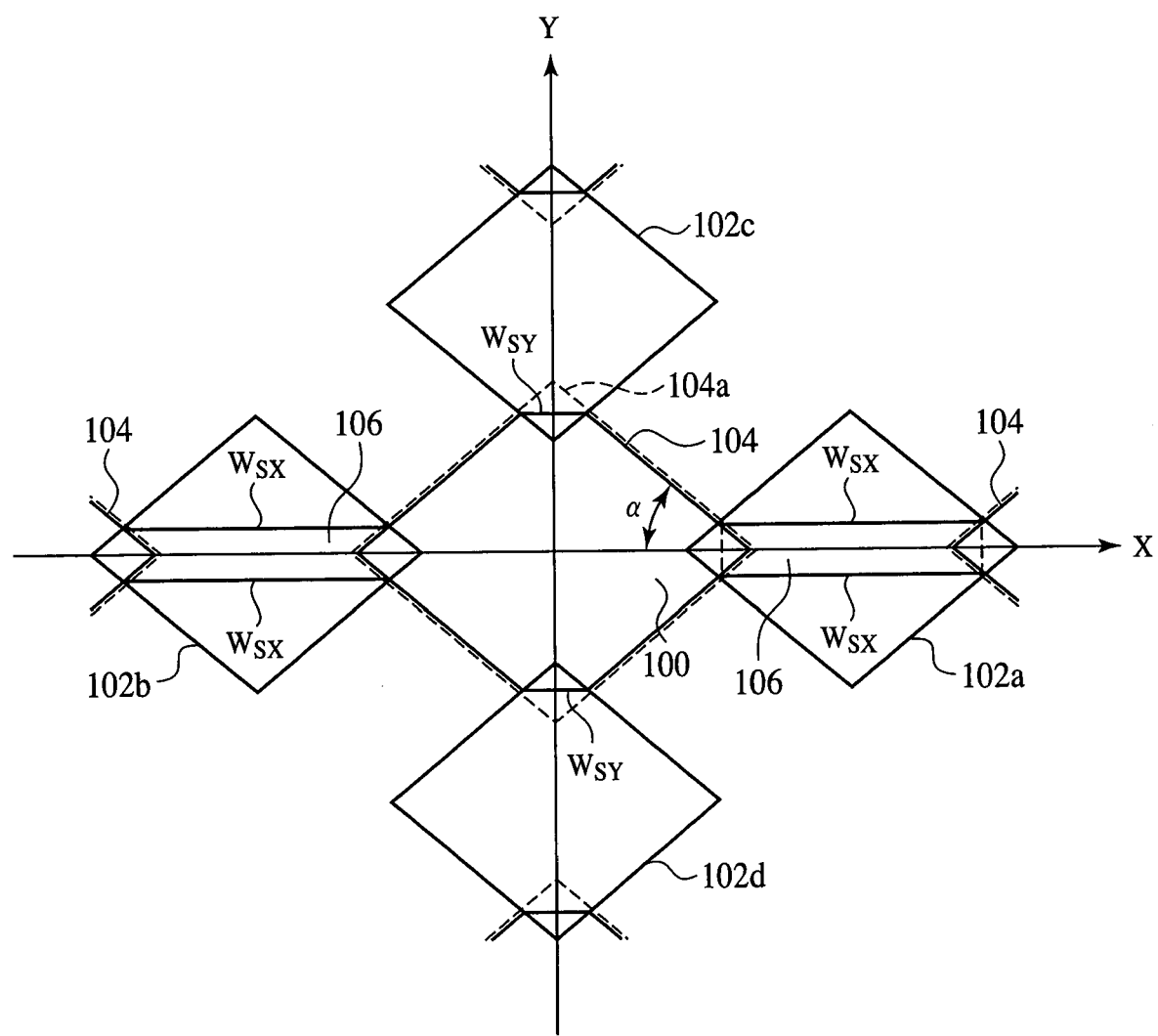

The control gate 104 has, as the basic shape, a rhombus (basic rhombic pattern 104a) which can sufficiently ensure the channel length L and the alignment allowance with the device isolation regions 102. Here, the basic shape is modified so as to sufficiently ensure the gap between the control gates which are adjacent in the Y-axial direction. That is, as shown in FIG. 6, the Y-axial ends of the control gate 104 are defined by the straight lines $W_{SY}$ interconnecting the intersections between the device isolation region 102c, 102d and the basic rhombic pattern 104a. In other words, the shape of the control gate 104 is a hexagonal shape defined by removing from the basic rhombic pattern 104a triangles defined by interconnecting the intersections between the device isolation regions 102 and the basic rhombic pattern 104a. The control gates adjacent in the X-axial direction are interconnected with each other by rectangular patterns 106 enclosed by 2 straight lines $W_{SX}$ interconnecting the intersections of the basic rhombic patterns 104a and the device isolation regions 102a, 102b, and form a word line extended in the X-axial direction.

Next, for estimating the overlay (total overlay) required between the patterns, based on the basic pattern described above, the alignment allowance for lithography and size shifts are taken into account.

Because the fluctuation $ISO_{CD}$ of the width of the device isolation regions 102 varies depending on the rotation angle θ, both the fluctuation $ISO_{CDX}$ in the X-axial direction and the fluctuation $ISO_{CDY}$ in the Y-axial direction must be taken into account. The X-axial fluctuation $ISO_{CDX}$ and the Y-axial fluctuation $ISO_{CDY}$ are respectively expressed by $$ISO_{CDX} = \pm\frac{ISO_{CD}}{\sin\theta}, \quad ISO_{CDY} = \pm\frac{ISO_{CD}}{\cos\theta}.$$

When the angle formed by a side of the basic rhombic pattern 104a to the X axis is α, the X-axial fluctuation of the width of the control gate $WL_{CDX}$ and the Y-axial fluctuation of the width of the control gate $WL_{CDY}$ are respectively expressed by $$WL_{CDX} = \frac{WL_{CD}}{\sin\alpha}, \quad WL_{CDY} = WL_{CD}.$$

Accordingly, with $WL_{CDX} \approx WL_{CD}$, when the X-axial overlay of the control gate 104 with respect to the device isolation region 102 is $AL_{WX}$, and the Y-axial overlay is $AL_{WY}$, the X-axial total overlay $WL_{OVX}$, the Y-axial total overlay $WL_{OVY}$, and their synthetic component $V_{XY}$ are respectively expressed by $$WL_{OVX} = \sqrt{(ISO_{CDX}^2 + WL_{CDX}^2 + AL_{WX}^2)}.$$

$$WL_{OVY} = \sqrt{(ISO_{CDY}^2 + WL_{CD}^2 + AL_{WY}^2)}.$$

$$V_{XY} = \sqrt{(WL_{OVX}^2 + WL_{OVY}^2)}.$$

The X-axial overlay $AL_{WX}$ and the Y-axial overlay $AL_{WY}$ are the minimum overlays required between the control gate 104 and the device isolation region 102 to constitute the nonvolatile semiconductor memory device.

Next, taking into account the above-described overlays between the control gate 104 and the device isolation region 102, the pattern of the control gate 104 will be explained again. In the following explanation, in consideration of the symmetry of the pattern, the first quadrant region alone of the coordinate system will be noted so as to simplify the explanation.

The coordinates of the intersections between the edge of the control gate 104 and the edge of the device isolation regions 102 are defined by the X-axial total overlay $WL_{OVX}$ and the Y-axial total overlay $WL_{OVY}$.

Figure 7:
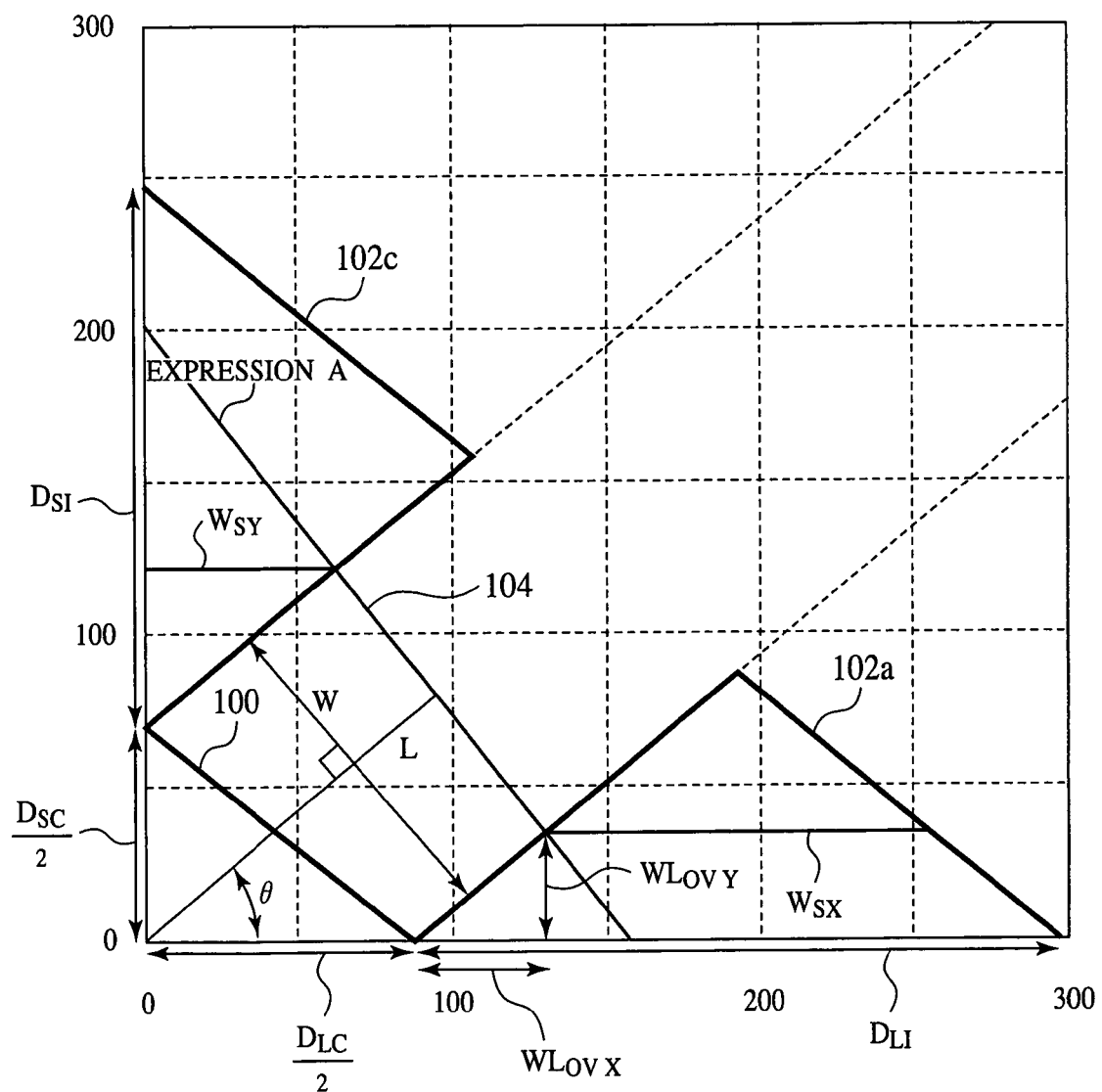

First, when the X-axial direction is noted, the coordinates of the intersection between the edge of the control gate 104 and the edge of the device isolation region 102a have minimum values when, as shown in FIG. 7, the X-axial distance between the summit of the device isolation region 102a on the side of the origin and the intersection is equal to the X-axial total overlay $WL_{OVX}$, and the Y-axial distance from the intersection is equal to the Y-axial total overlay $WL_{OVY}$. That is, the coordinate of the intersection between the edge of the control gate 104 and the edge of the device isolation region 102a is expressed by $$\left(\frac{D_{LC}}{2} + WL_{OVX}, W_{LOVY}\right). \quad (1)$$

The edge of the control gate always passes the channel end, and accordingly, the edge of the control gate passes the following coordinate.

$$\left(\frac{L}{2}\cos\theta, \frac{L}{2}\sin\theta\right) \quad (2)$$

Here, $D_{LW}$ and $D_{SW}$ are X-axial diagonal length and the Y-axial diagonal length of the basic rhombic pattern 104 of the control gate 104.

Thus, the edge of the control gate 104 in this region is expressed by the following expression.

$$y = -\frac{D_{SW}}{D_{LW}}x + \frac{D_{SW}}{2} \quad (3)$$

When Expression (3) is substituted with Expression (1) and Expression (2), Expression (1') and Expression (2') described below are given.

$$\frac{L}{2}\sin\theta = -\frac{D_{SW}}{D_{LW}} \cdot \frac{L}{2}\cos\theta + \frac{D_{SW}}{2} \quad (2')$$

$$WL_{OVY} = -\frac{D_{SW}}{D_{LW}}(D_{LC} + WL_{OVX}) + \frac{D_{SW}}{2} \quad (1')$$

By using the simultaneous equation of Expression (1') and Expression (2'), the diagonal lengths $D_{LW}$, $D_{SW}$ of the basic rhombic pattern 104a are given. Numerous solutions are given, and the general solution is given by the relational expression of the diagonal lengths $D_{LW}$, $D_{SW}$. That is, the relationship between the diagonal lengths $D_{LW}$, $D_{SW}$ given when the X-axis diagonal length of the basic rhombic pattern 104 is minimum, and the Y-axial diagonal length $D_{SW}$ is maximum is expressed by $$D_{LW} = \frac{D_{LC} + 2 \cdot WL_{OVX} - L \cdot \cos\theta}{L \cdot \sin\theta - 2 \cdot WL_{OVY}} \cdot D_{SW}. \quad A$$

Figure 8:
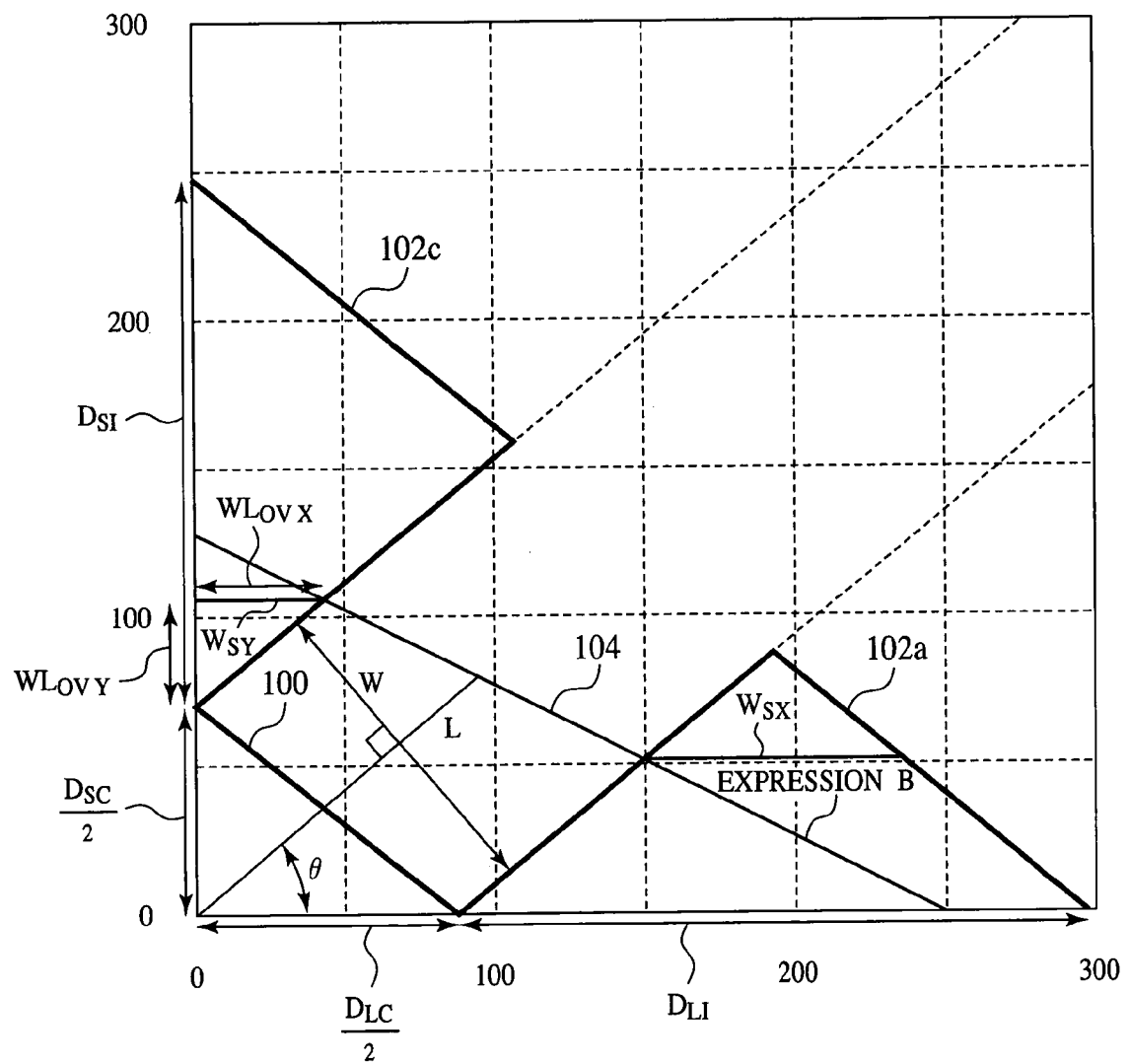

Similarly, when the Y-axial direction is noted, the coordinate of the intersection between the edge of the control gate 104 and the edge of the device isolation region 102c have minimum values when, as shown in FIG. 8, the Y-axial distance between the summit of the device isolation region 102c on the side of the origin and the intersection is equal to the Y-axial total overlay $WL_{OVY}$, and the X-axial distance from the intersection is equal to the X-axial total overlay $WL_{OVX}$. That is, the coordinate of the intersection between the edge of the control gate 104 and the edge of the device isolation region 102c is expressed by $$\left(WL_{OVX}, \frac{D_{SC}}{2} + W_{LOVY}\right) \quad (4)$$

When Expression (3) is substituted with Expression (4), Expression (4') described below is given.

$$D_{SC} + WL_{OVY} = -\frac{D_{SW}}{D_{LW}} \cdot WL_{OVX} + \frac{D_{SW}}{2} \quad (4')$$

The diagonal lengths $D_{LW}$, $D_{SW}$ of the basic rhombic pattern 104a are found by using the simultaneous equation of Expression (4') and Expression (2'), whereby the following general expression B expressing the relationship between the diagonal lengths $D_{LW}$, $D_{SW}$ given when the X-axis diagonal length of the basic rhombic pattern 104 is maximum, and the Y-axial diagonal length $D_{SW}$ is minimum is given.

$$D_{LW} = \frac{2 \cdot WL_{OVX} - L \cdot \cos\theta}{L \cdot \sin\theta - (D_{SC} + 2 \cdot WL_{OVY})} \cdot D_{SW} \quad B$$

An angle $\beta$ formed by the X axis to the side of the basic rhombic pattern 104a which can be laid out, ensuring a channel length L between Expression A and Expression B is expressed by the following relational expression under the condition of $WL_{CDX} \approx WL_{CD}$.

$$\beta = \tan^{-1}\left(\frac{D_{SW}}{D_{LW}}\right)$$

When a difference between the angle α and the angle β is Δθ, the Y-axial total overlay $WL_{OVY}$ to be actually given is expressed by $$WL_{CDX} = \frac{WL_{CD}}{\lim_{\Delta\theta\to 0}\sin(\beta+\Delta\theta)}$$

Thus, based on the above relational expressions, the diagonal lengths $D_{LW}$, $D_{SW}$ for each case can be given.

Figure 9:
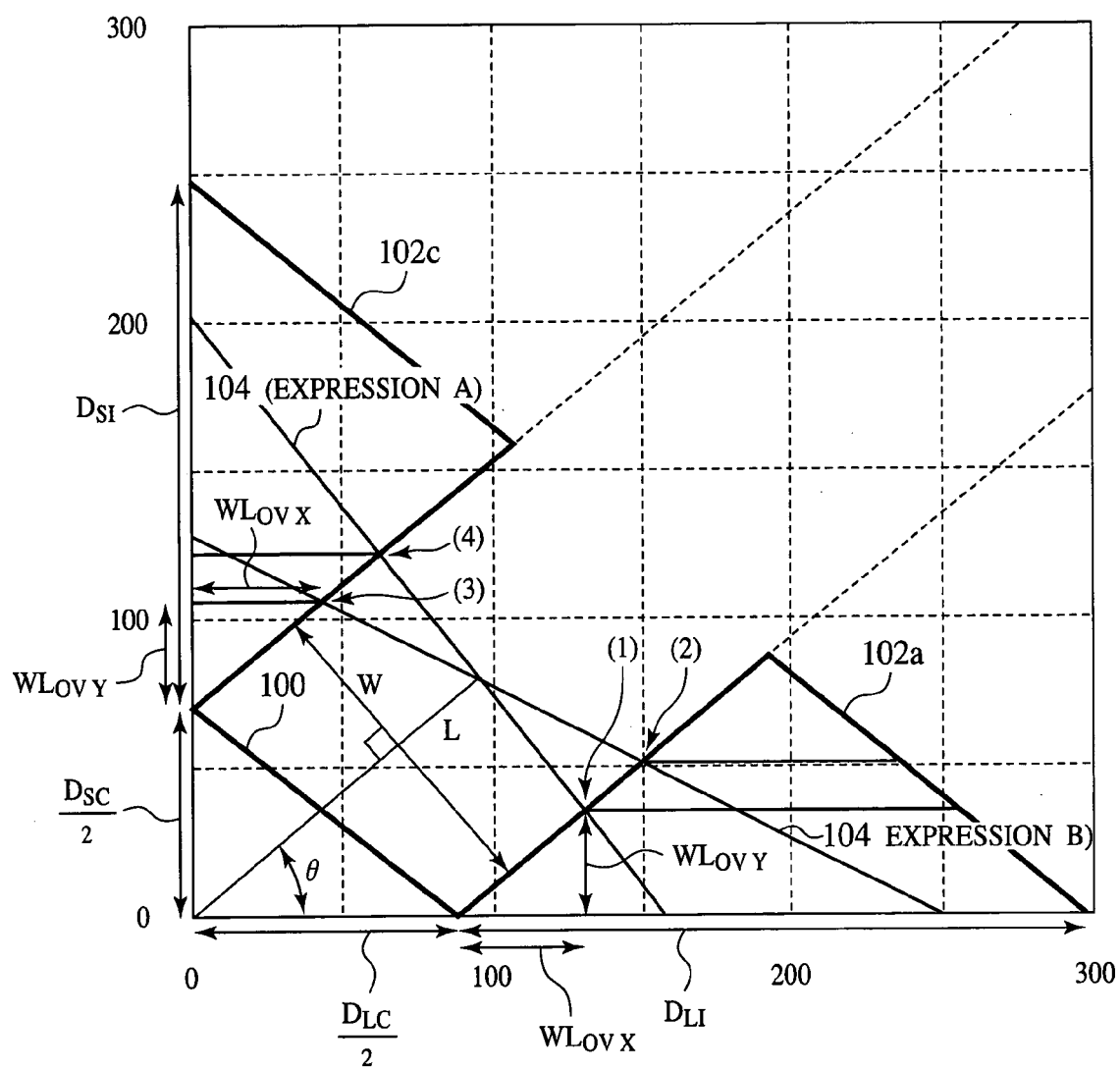

The basic rhombic pattern 104a of the control gate 104 given by the relationships of Expression A and Expression B has a resolution for laying out the control gate 104 when, as shown in FIG. 9, the following 2 conditions, (A) the intersection (1) of the edge of the control gate 104 and the edge of the device isolation region 102a given by Expression A is equal to or nearer to the origin than the intersection (2) between the edge of the control gate 104 and the edge of the device isolation region 102a given by Expression B, and (B) the intersection (3) between the edge of the control gate 104 and the edge of the device isolation region 102c given by Expression B is equal to or nearer to the origin than the intersection (4) between the edge of the control gate 104 and the edge of the device isolation region 102c given by Expression A are both satisfied.

Based on the above-described expressions, the diagonal lengths $D_{LW}$, $D_{SW}$ of an arbitrary basic rhombic pattern 104a which can be laid out, ensuring the channel length L between Expression A and Expression B at an angle θ can be given.

In the above explanation, the shape of the control gate 104 is a hexagon given by removing from the basic rhombic pattern 104a triangles given by connecting the intersections between the device isolation regions 102 and the basic rhombic pattern 104a, but the basic rhombic pattern 104 may be used as it is.

In this case, the Y-axial total layover $WL_{OVY}$ is expressed by $$WL_{CDY} = \frac{WL_{CD}}{\cos\alpha}.$$

The Y-axial total overlay to be actually given is expressed by $$WL_{CDY} = \frac{WL_{CD}}{\lim_{\Delta\theta\to 0}\cos(\beta+\Delta\theta)}$$

Next, taking into account the overlay between the control gate 104 and the device isolation region 102 described above, the pattern of the device isolation region 102 will be again explained.

The length of one side of the device isolation regions 102 $W_{ISO}$ has the minimum value given by adding the synthetic component of the total overlays $V_{XY}$ to the overlay between the control gate 104 and the channel region 100. To compute the minimum length $W_{ISO}$ it is necessary to give the coordinate of the intersection between the above-described Expression (3) expressing one side of the control gate 104 and the following general expression expressing one side of the device isolation regions 102.

$$y = \tan\theta \cdot x \pm \frac{D_{SC}}{2} \quad (3')$$

Here, the X coordinate of the intersection is expressed by $$x = \frac{D_{SW} \pm D_{SC}}{2\left(\tan\theta + \frac{D_{SW}}{D_{LW}}\right)}. \quad (3'')$$

On the other hand, the Y coordinate of the intersection is given by substituting Expression (3″) with Expression (3).

Based on the given coordinate of the intersection, the distance to the X axis or to the Y axis can be given. Of the values given by adding the synthetic component of the total overlays $V_{XY}$ to the distance, a larger value is the minimum length $W_{ISO}$.

That is, when an X-axial length is $W_{ISOX}$, and a Y-axial length is $W_{ISOY}$, a length $W_{ISO}$ of one side of the device isolation region 102 is expressed by $$W_{ISOX} = \frac{y}{\sin\theta} + V_{XY},$$

$$\therefore W_{ISOX} = \frac{D_{SW} \cdot D_{SC}(D_{LW}-D_{LC})}{2\cdot\sin\theta\cdot(D_{SC}\cdot D_{LW}+D_{SW}\cdot D_{LC})} + \sqrt{WL_{OVX}^2 + WL_{OVY}^2},$$

$$W_{ISOY} = \frac{x}{\cos\theta} + V_{XY},$$

$$\therefore W_{ISOY} = \frac{D_{LW}\cdot D_{LC}(D_{SW}-D_{SC})}{2\cdot\cos\theta\cdot(D_{SC}\cdot D_{LW}+D_{SW}\cdot D_{LC})} + \sqrt{WL_{OVX}^2 + WL_{OVY}^2},$$

and a minimum $W_{ISO}$ containing a sufficient alignment allowance can be computed.

Based on this result, the lengths of the diagonals of the device isolation region 102 can be given. That is, the length $D_{LI}$ of the diagonal of the device isolation regions 102 along the X axis of the basic rhombic pattern, and a length $D_{SI}$ of the diagonal along the Y axis are expressed by $$D_{LI}=2\cdot W_{ISO}\cdot\cos\theta$$

$$D_{SI}=2\cdot W_{ISO}\cdot\sin\theta.$$

Next, the case that the summits of the basic rhombic pattern 104a of the control gate 104 on the device isolation regions 102 are defined by the total overlays will be explained.

First, the method for deciding a length $D_{SW}$ which makes the total overlay of the Y-axial summit minimum will be explained.

Figure 10:
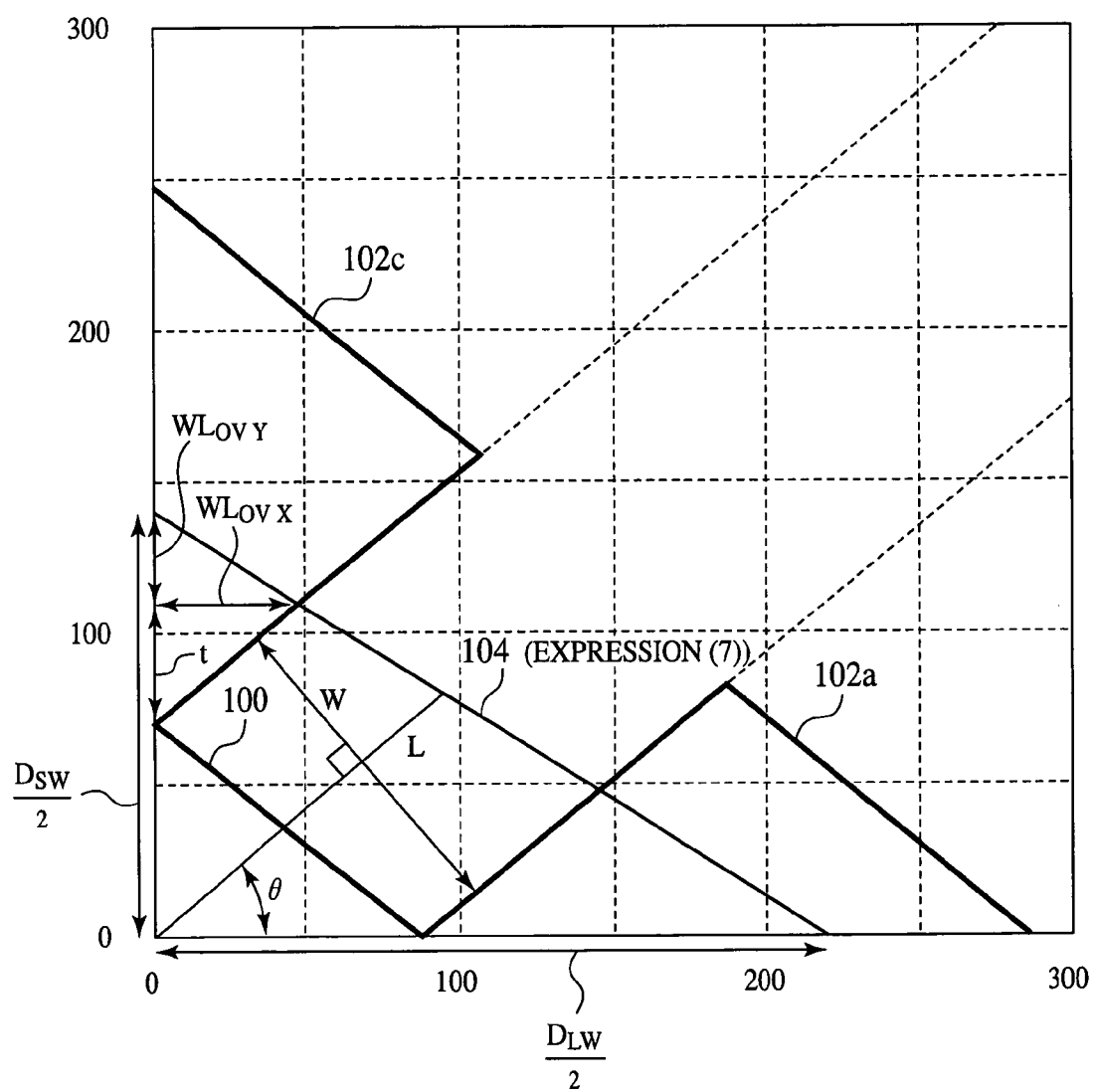

As shown in FIG. 10, the length $D_{SW}$ of the diagonal of the basic rhombic pattern 104a is the sum of the length of the total overlays $WL_{OVY}$ on both sides, the length $D_{SC}$ of the diagonal of the channel region 100, and the length of the lengths t between the channel region 100 on the Y axis and the total overlay $WL_{OVY}$ on both sides, and is expressed by $$\frac{D_{SW}}{2} = \frac{D_{SC}}{2} + t + WL_{OVY}. \quad (5)$$

Here, the length t is expressed by $$\tan\theta = \frac{t}{WL_{OVX}} \quad (6)$$

$$t = WL_{OVX} \cdot \tan\theta.$$

When Expression (5) is substituted with Expression (6), the following expression is obtained.

$$\frac{D_{SW}}{2} = \frac{D_{SC}}{2} + WL_{OVX} \cdot \tan\theta + WL_{OVY} \quad C_1$$

$$\therefore D_{SW} = D_{SC} + 2(WL_{OVX} \cdot \tan\theta + WL_{OVY})$$

At this time, one side of the basic rhombic patterns 104a of the control gate 104 is expressed by the following Expression (7)

$$y = -\frac{D_{SW}}{D_{LW}} \cdot x + \frac{D_{SW}}{2}, \quad (7)$$

because the coordinate of the intersection with the Y axis is expressed by $$\left(\frac{D_{SW}}{2}, 0\right),$$

and the coordinate of the intersection with the X axis is expressed by $$\left(0, \frac{D_{LW}}{2}\right).$$

Expression (7) must pass coordinate $$\left(\frac{L}{2}\cos\theta, \frac{L}{2}\sin\theta\right) \quad (8)$$

which can be taken by the center line of the channel at the channel end.

When Expression (5) is substituted with Expression (6), the following expression expressing the relationship between the lengths $D_{SW}$, $D_{LW}$ of the diagonals can be obtained.

$$D_{LW} = \frac{D_{SW} \cdot L \cdot \cos\theta}{D_{SW} - L \cdot \sin\theta} \quad C_2$$

Accordingly, lengths $D_{SW}$, $D_{LW}$ of the diagonals which simultaneously satisfy Expression $C_1$ and Expression $C_2$ are minimum values given by defining the Y-axial total overlay.

Next, the method for deciding a length $D_{LW}$ of the diagonal which makes the total overlay of the X-axial summit minimum will be explained in the same procedure.

Figure 11:
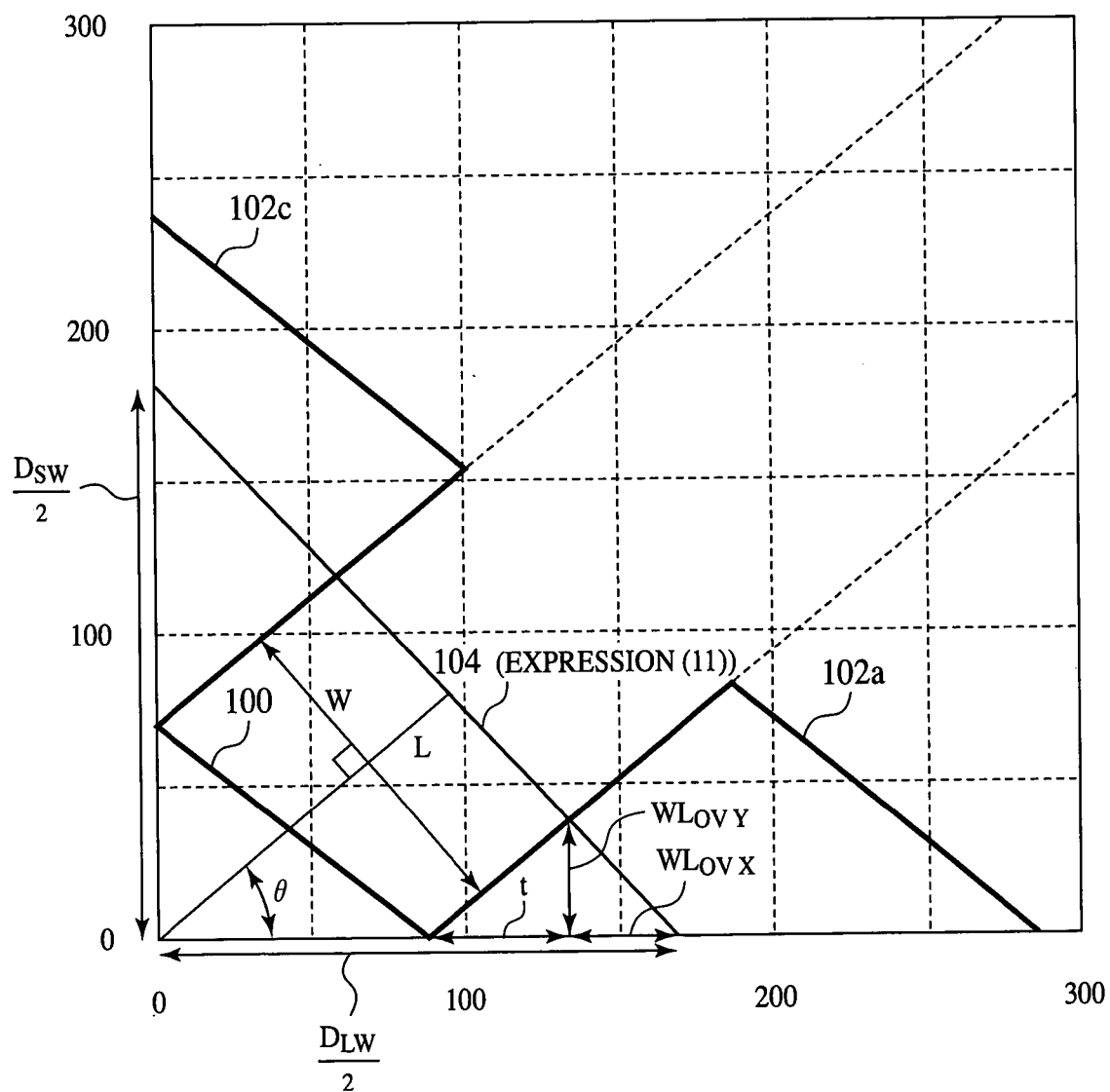

As shown in FIG. 11, the length $D_{LW}$ of the diagonal of the basic rhombic pattern 104a is a sum of the length of the total overlays $WL_{OVX}$ on both sides, the length $D_{LC}$ of the diagonal of the channel region 100, and the length of the lengths t between the channel region 100 on the Y axis and the total overlay $WL_{OVX}$ on both sides, and is expressed by $$\frac{D_{LW}}{2} = \frac{D_{LC}}{2} + t + WL_{OVX}. \quad (9)$$

Here, the length t is expressed by $$\tan\theta = \frac{WL_{OVY}}{t} \quad (10)$$

$$t = \frac{WL_{OVY}}{\tan\theta}.$$

When Expression (9) is substituted with Expression (10), $$\frac{D_{LW}}{2} = \frac{D_{LC}}{2} + \frac{WL_{OVY}}{\tan\theta} + WL_{OVX} \quad D_1$$

$$\therefore D_{LW} = D_{LC} + \frac{2 \cdot WL_{OVY}}{\tan\theta} + 2 \cdot WL_{OVX}$$

can be obtained. At this time, one side of the basic rhombic patterns 104a of the control gate 104 is expressed by the following Expression (11), $$y = -\frac{D_{SW}}{D_{LW}} \cdot x + \frac{D_{SW}}{2} \quad (11)$$

because the coordinate of the intersection with the Y axis is expressed by $$\left(\frac{D_{SW}}{2}, 0\right),$$

and the coordinate of the intersection with the X axis is expressed by $$\left(0, \frac{D_{LW}}{2}\right).$$

Expression (11) must pass coordinate $$\left(\frac{L}{2}\cos\theta, \frac{L}{2}\sin\theta\right) \quad (12)$$

which can be taken by the center line of the channel at the channel end.

When Expression (11) is substituted with Expression (12), the following formula can be obtained.

$$D_{LW} = \frac{D_{SW} \cdot L \cdot \cos\theta}{D_{SW} - L \cdot \sin\theta}$$

This expression is the same as Expression $C_2$ described above. When this expression is modified so as to easily give the length $D_{SW}$ of the diagonal, the following expression expressing the relationship between the lengths $D_{SW}$, $D_{LW}$ of the diagonals can be obtained.

$$D_{SW} = \frac{D_{LW} \cdot L \cdot \sin\theta}{D_{LW} - L \cdot \cos\theta} \quad D_2$$

Accordingly, the lengths $D_{SW}$, $D_{LW}$ of the diagonals which simultaneously satisfy Expression $D_1$ and Expression $D_2$ are minimum values given by defining the X-axial total overlay.

Next, the method for fabricating the nonvolatile semiconductor memory device according to the present embodiment will be explained with reference to FIGS. 12 to 36.

First, a silicon oxide film 12, a silicon nitride film 14 and an antireflection film 16 are formed on a silicon substrate 10. Then, a KrF negative photoresist film 18 is formed on the antireflection film 16.

Figure 12:
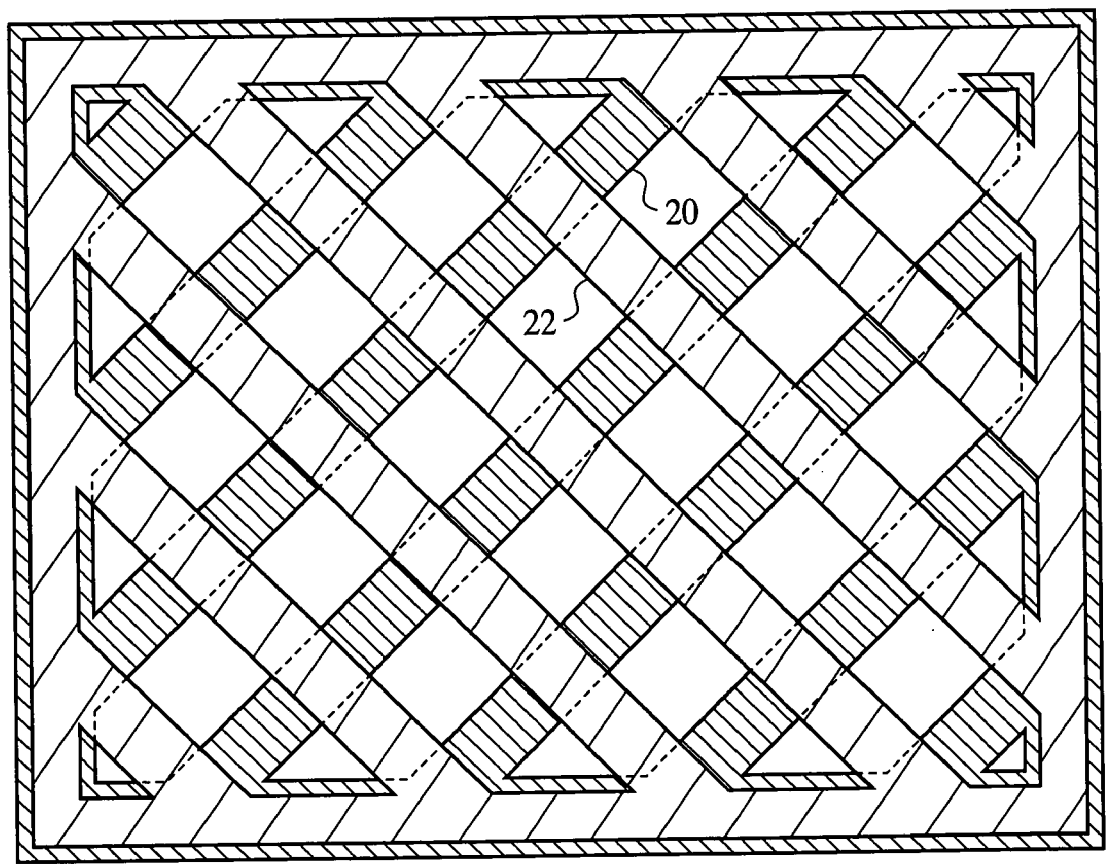

Then with mask patterns 20, 22 as shown in FIG. 12, the photoresist film 18 is double exposed. The mask patterns 20, 22 are simple line and space patterns which are normal to each other. The outermost borders of the patterns of the mask patterns 20, 22 are framed so as to ensure the alignment allowance. The line patterns of the mask patterns 20, 22 have, e.g., a 133 nm-width and laid out at, e.g., a 176 nm spacing.

Figure 13:
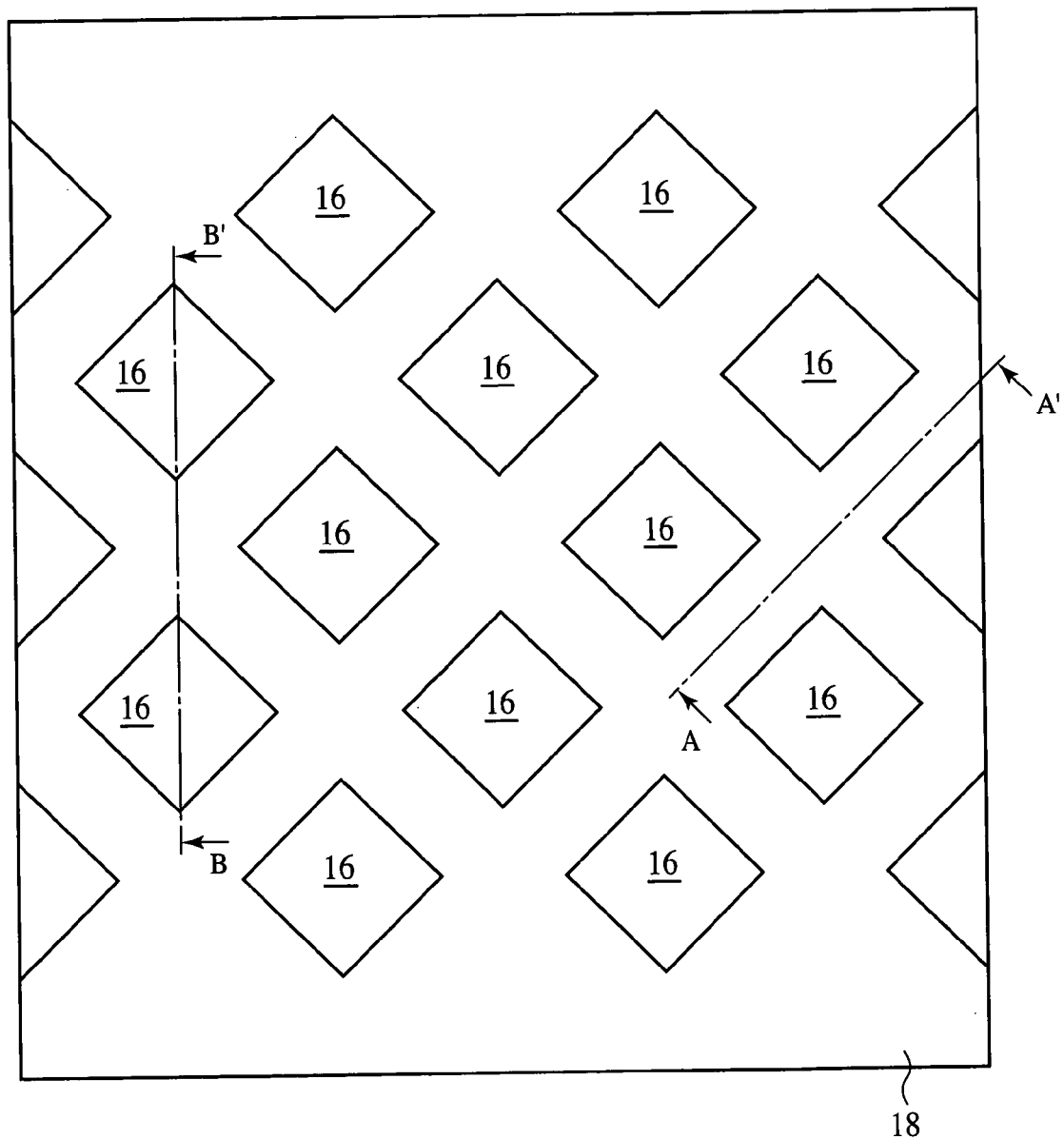
Figure 14A:
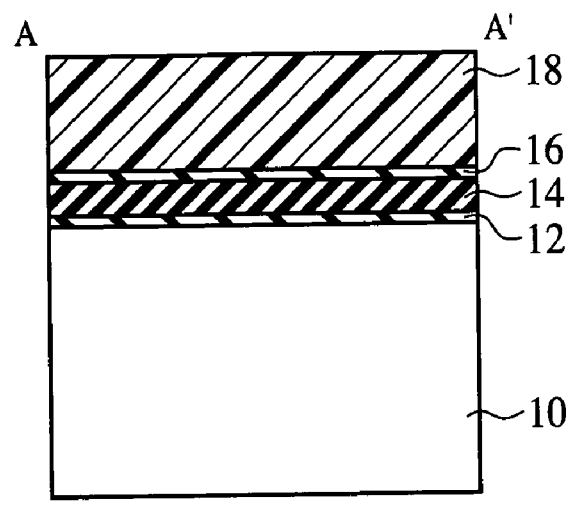
FIGS. 14A–14B, 16A–16B, 18A–18B, 19A–19B, 21A–21B, 23A–23B, 25A–25B, 27A–27B, 28A–28C, 30A–30B, 32A–32B, 34 and 36 are sectional views of the nonvolatile semiconductor memory device in the steps of the method for fabricating the nonvolatile semiconductor memory device according to the embodiment of the present invention, which show the method.
Figure 14B:
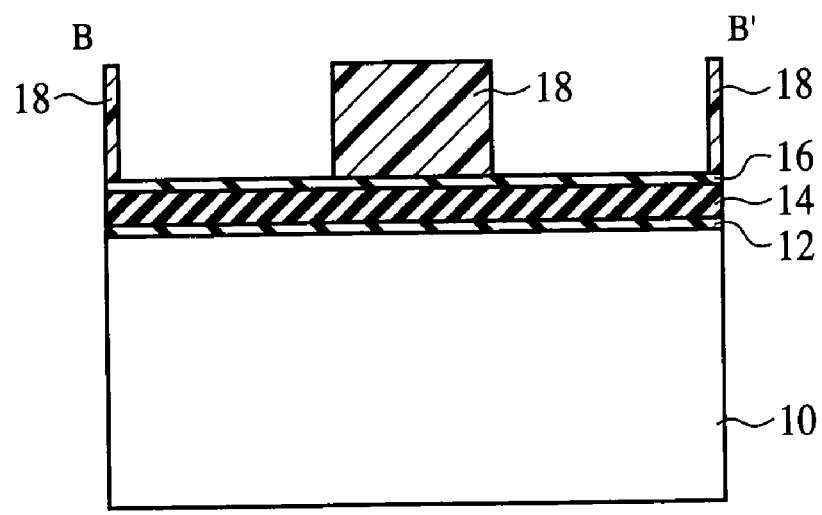

With the mask patterns 20, 22 shown in FIG. 12, double exposure is performed, and the photoresist film 18 after developed is patterned into a net covering the region to be the active regions (FIGS. 13, 14A and 14B). The photoresist film 18 is double exposed so as to suppress the proximity effect at the pattern corners and to make the shape for the device isolation to a rectangular shape.

Next, with the photoresist film 18 as the mask, the silicon nitride film 14, the silicon oxide film 12 and the silicon substrate 10 are anisotropically etched to form the device isolation trenches 24 in the silicon substrate 10.

After the photoresist film 18 has been removed, a liner oxide film (not shown) is formed on the surface of the device isolation trench 24 by, e.g., thermal oxidation.

Then, a silicon oxide film is deposited on the entire surface by, e.g., CVD method to fill the silicon oxide film in the device isolation trenches 24.

Then, with the silicon nitride film 14 as the stopper, the silicon oxide film is polished by, e.g., CMP method to form the device isolation film 26 buried in the device isolation trenches 24. The device isolation film 26 has repeated rectangular patterns as shown in FIG. 15. By using the mask patterns 20, 22 of the above-described size, the rectangular patterns one side of which is, e.g., 186 nm are laid out at, e.g., a 123 nm-spacing. The nonvolatile semiconductor memory device using this size has a unit cell area per 1 bit of about 0.048 μm²/bit.

Figure 16A:
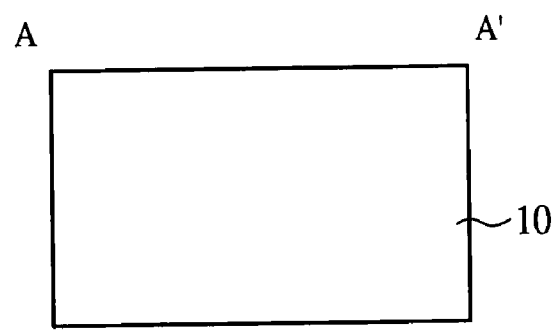
Figure 16B:
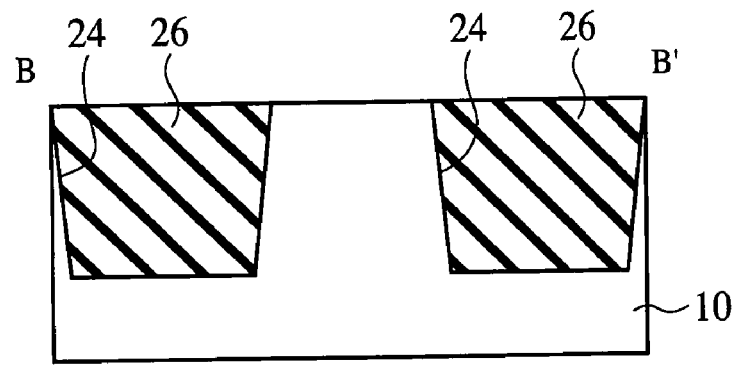

Then, the antireflection film 16, the silicon nitride film 14 and the silicon oxide film 12 are sequentially removed (FIGS. 16A and 16B).

Figure 17:
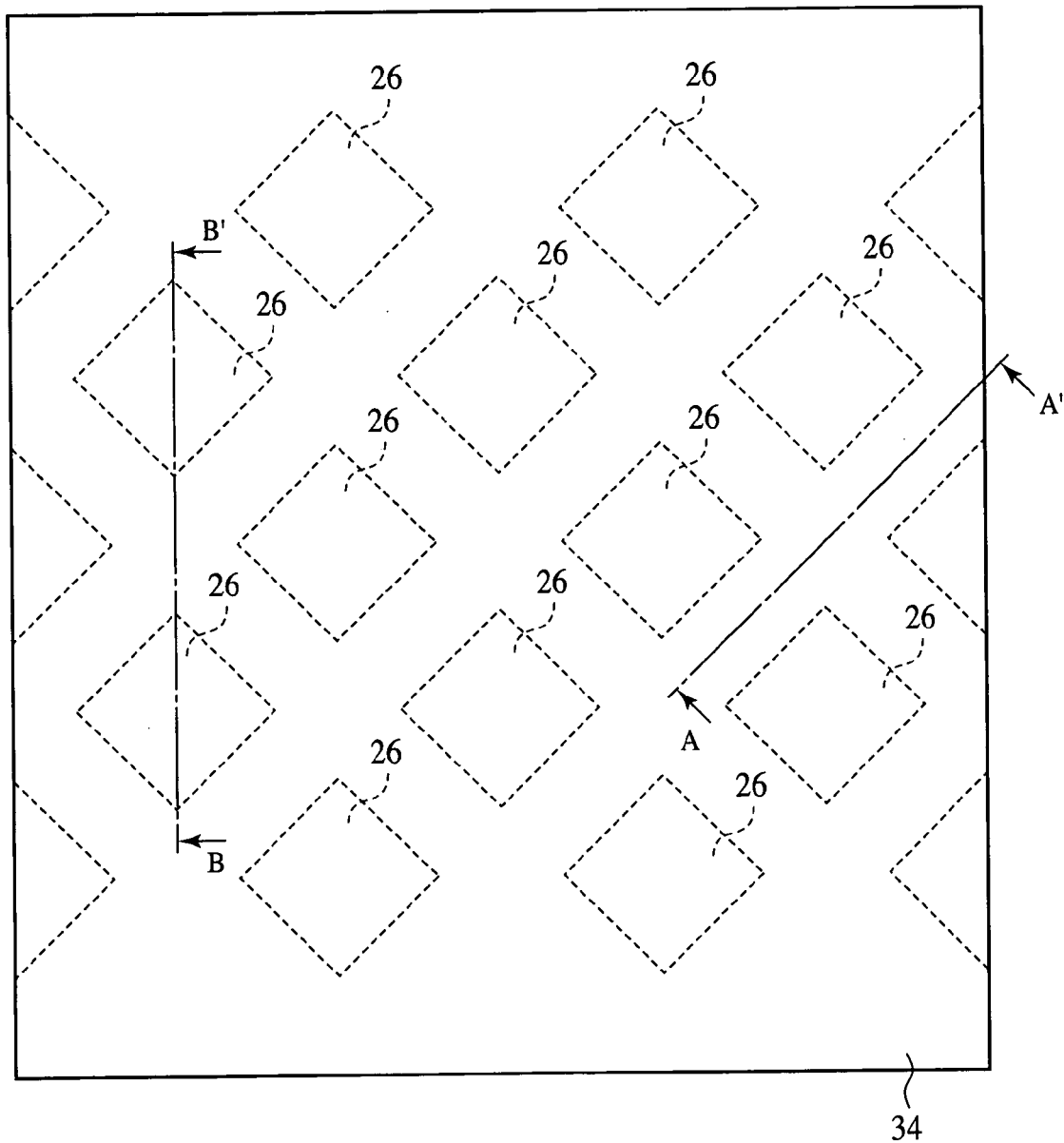
Figure 18A:
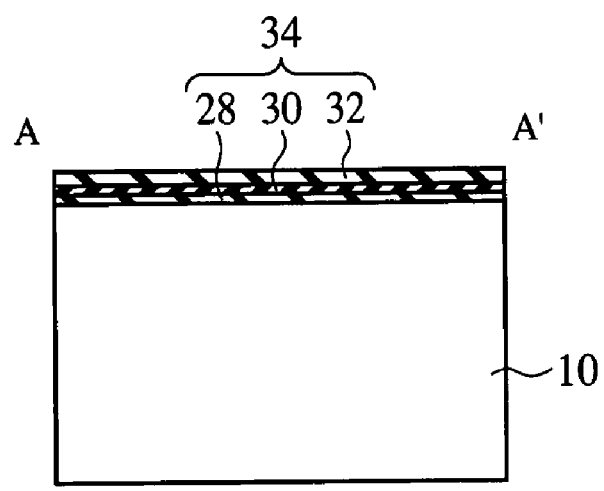
Figure 18B:
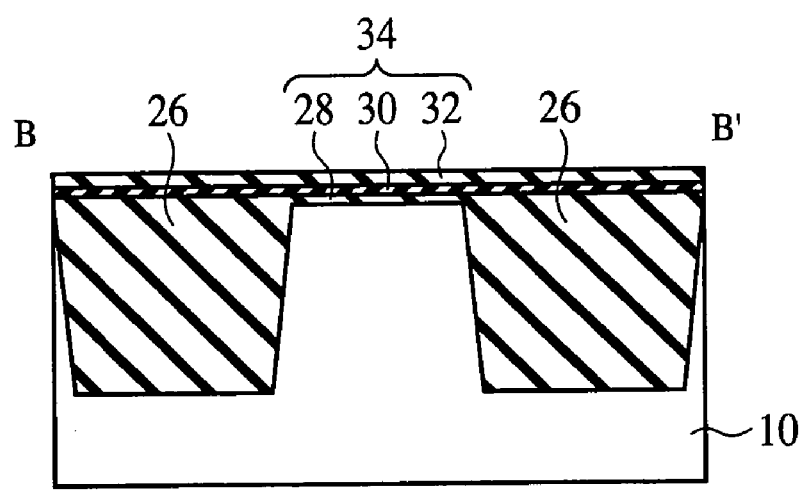

Next, on the entire surface, a silicon oxide film 28, a silicon nitride film 30 and a silicon oxide film 32 are sequentially formed respectively by, e.g., thermal oxidation, CVD method and thermal oxidation to form the charge retaining insulating film 34 of the ONO film (FIG. 17, 18A and 18B).

Figure 19A:
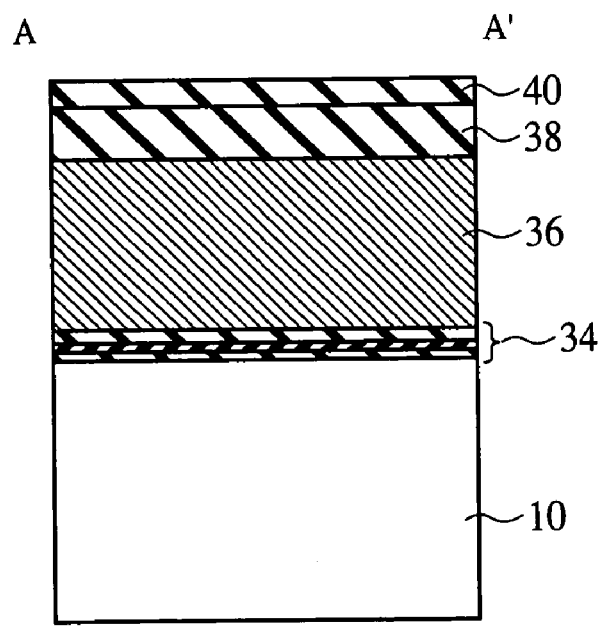
Figure 19B:
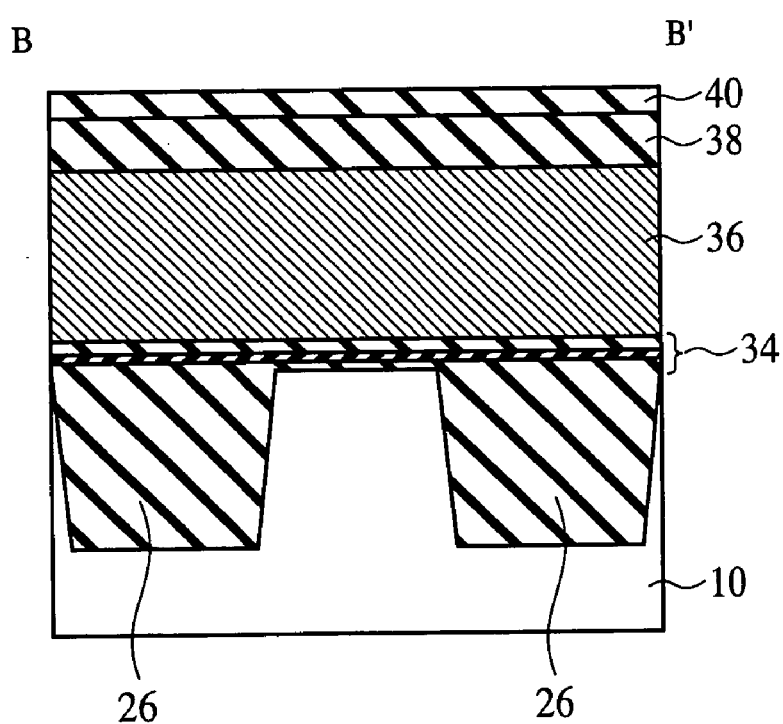

Then, on the charge retaining insulating film 34, a polycrystalline silicon film 36, a hard mask film 38 of, e.g., silicon oxide film and an antireflection film 40 are deposited by, e.g., CVD method (FIGS. 19A and 19B). In place of the polycrystalline silicon film 36, amorphous silicon film may be used.

Next, on the antireflection film 40, a photoresist film 42 having the pattern of the word lines is formed by photolithography.

Figure 20:
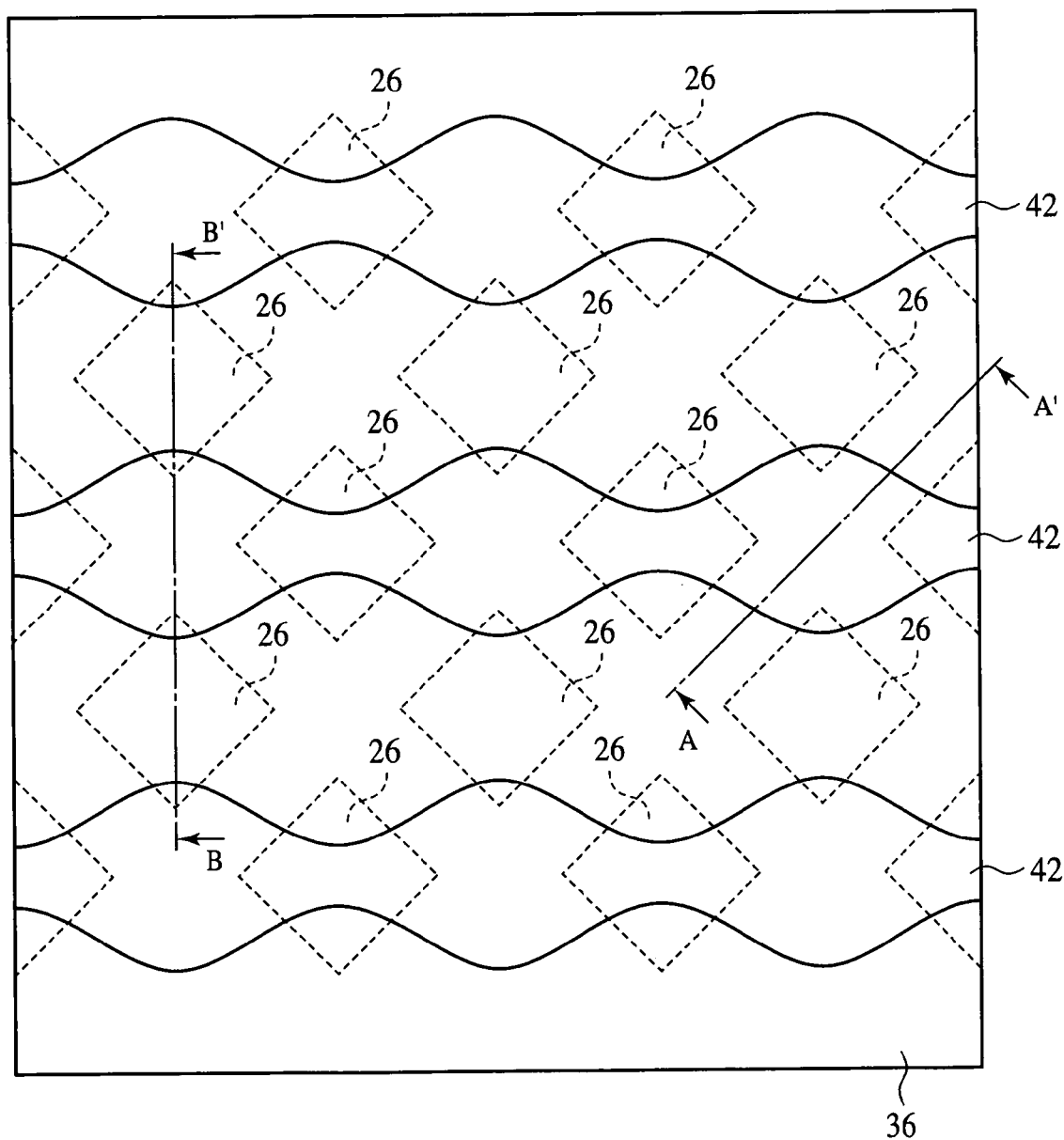

As shown in FIG. 20, the pattern of the photoresist film 42 is formed, covering every active regions but one enclosed by 4 device isolation films 26 adjacent to each other. The pattern of the photoresist film 42 is formed, extended across the direction of the diagonal of the rectangular device isolation films 26.

Preferably, the pattern of the photoresist film 42 is continuous curves which is point symmetrical with respect to the intersection between the center lines of the channels intersecting each other so that the respective channel lengths of the channels intersecting each other are the same, and the alignment allowance between the word lines and the device isolation film 26 can be ensured.

Figure 21A:
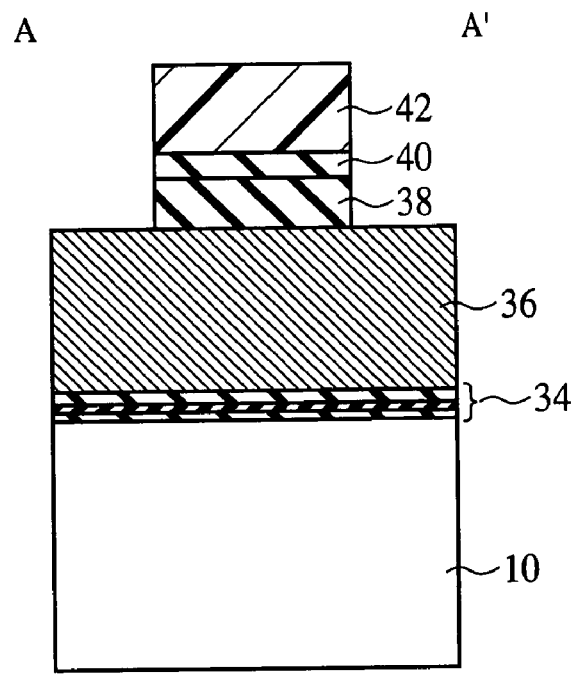
Figure 21B:
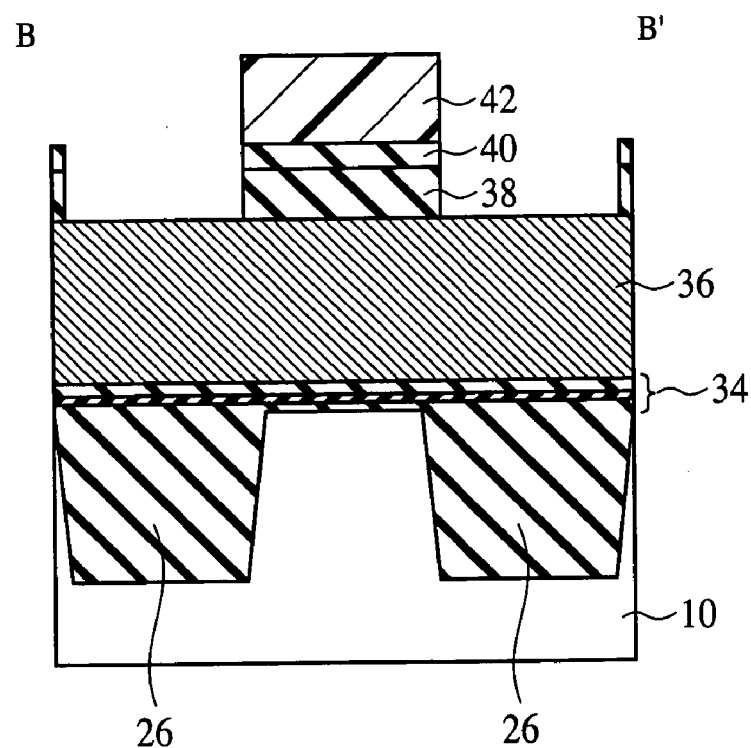

Next, with the photoresist film 42 as the mask, the hard mask film 38 is anisotropically etched to transfer the pattern of the photoresist film 42 to the hard mask film 38 (FIGS. 21A and 21B).

Then, the photoresist film 42 is removed by, e.g., ashing. At this time, the antireflection film 40 is concurrently removed.

Figure 22:
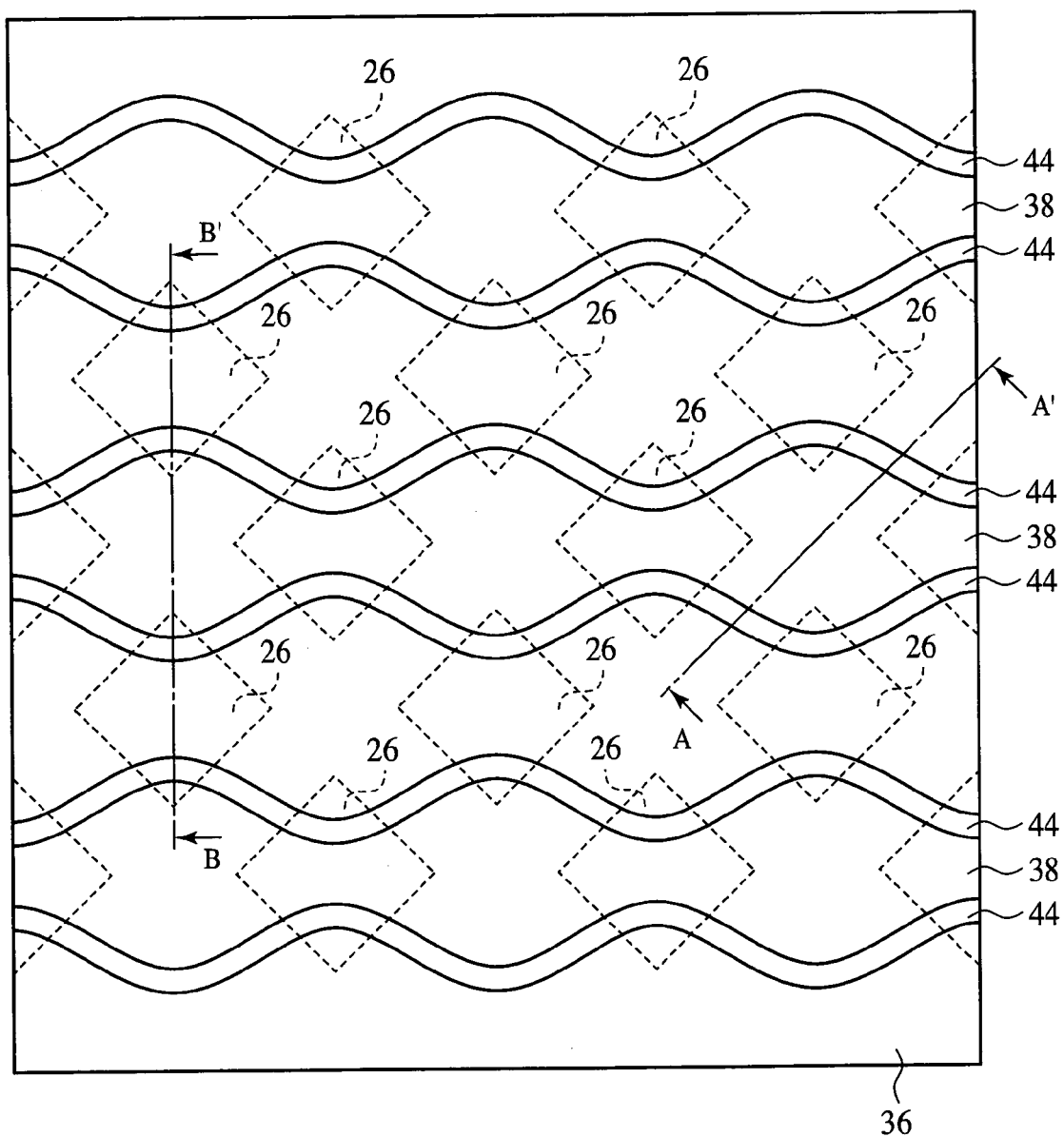
Figure 23A:
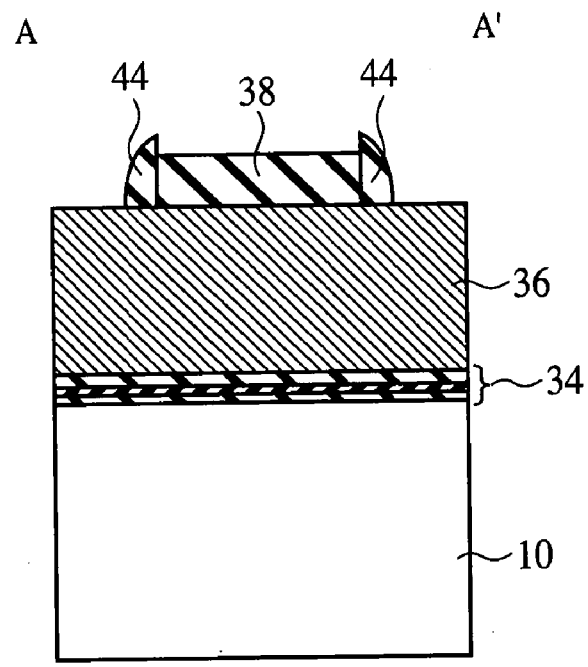
Figure 23B:
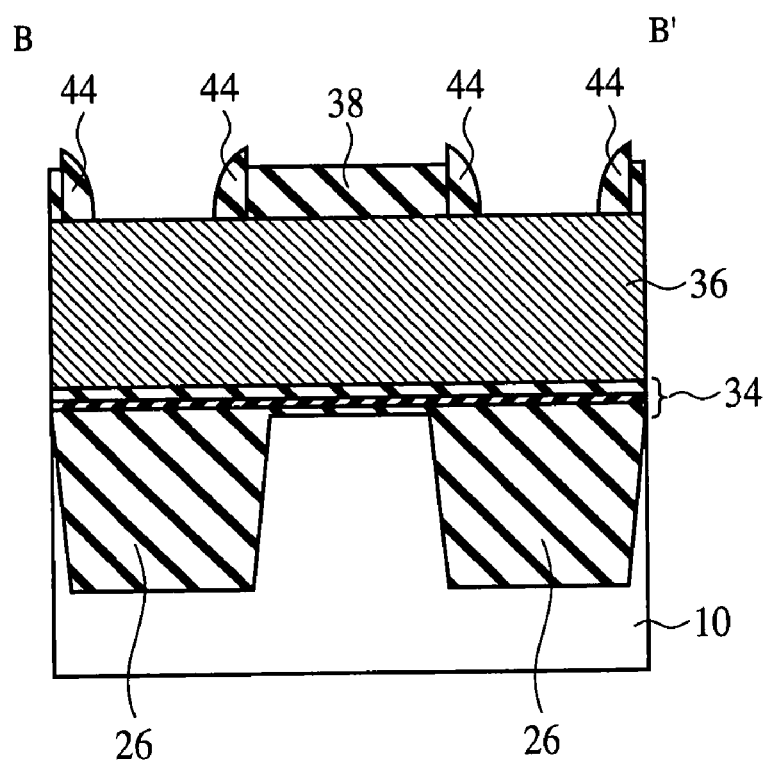

Then, a silicon oxide film is deposited by, e.g., CVD method and then is anisotropically etched to form a spacer film 44 of the silicon oxide film on the side walls of the patterned hard mask film 38 (FIGS. 22, 23A and 23B).

Next, with the hard mask film 38 and the spacer film 44 as the mask, the polycrystalline silicon film 36 is anisotropically etched to form the word lines 46 of the polycrystalline silicon film 36.

Figure 24:
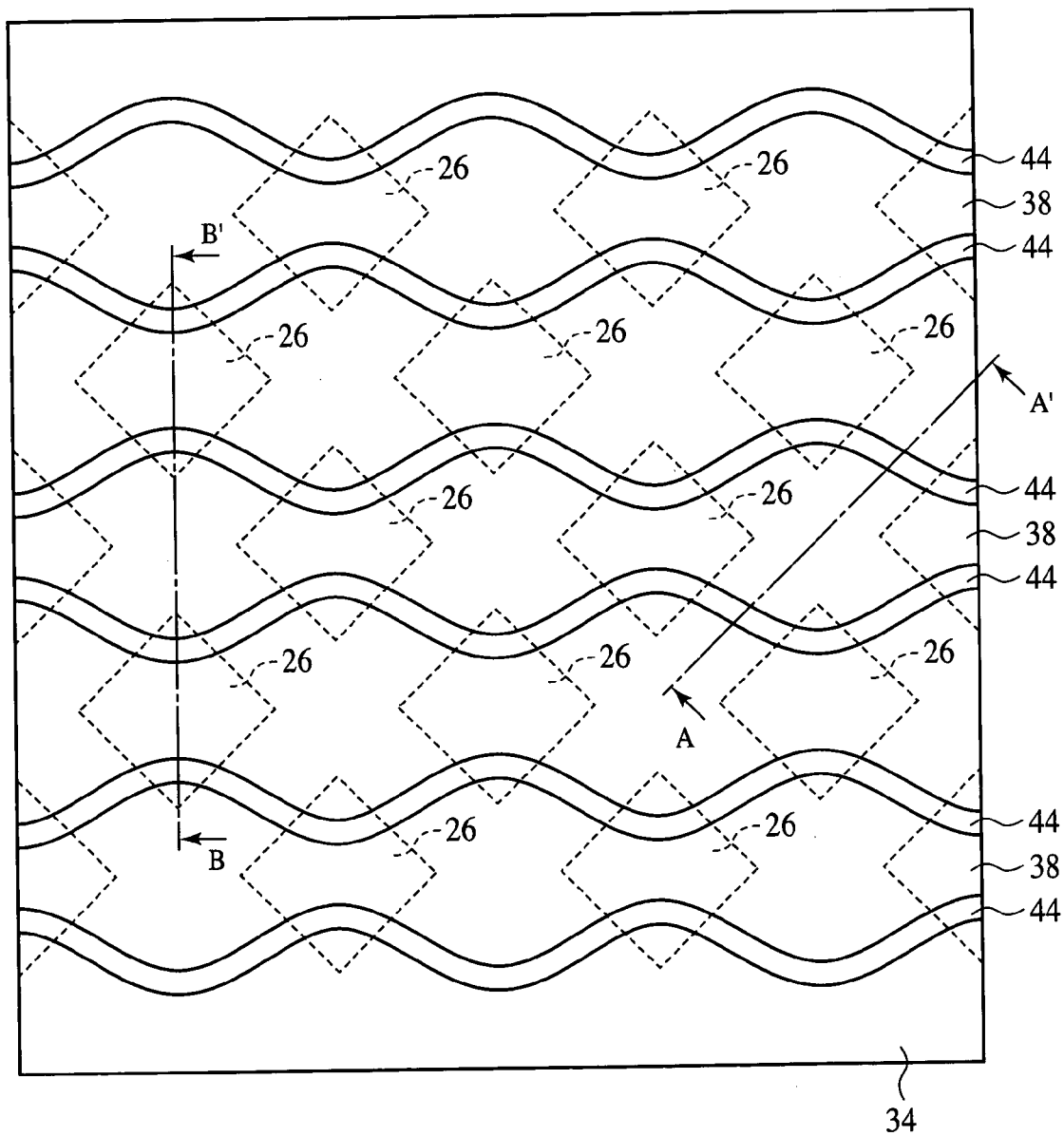
Figure 25A:
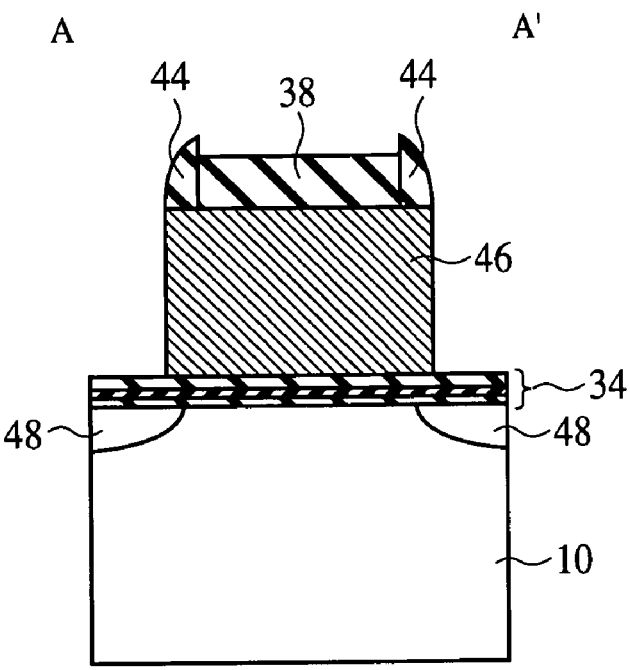
Figure 25B:
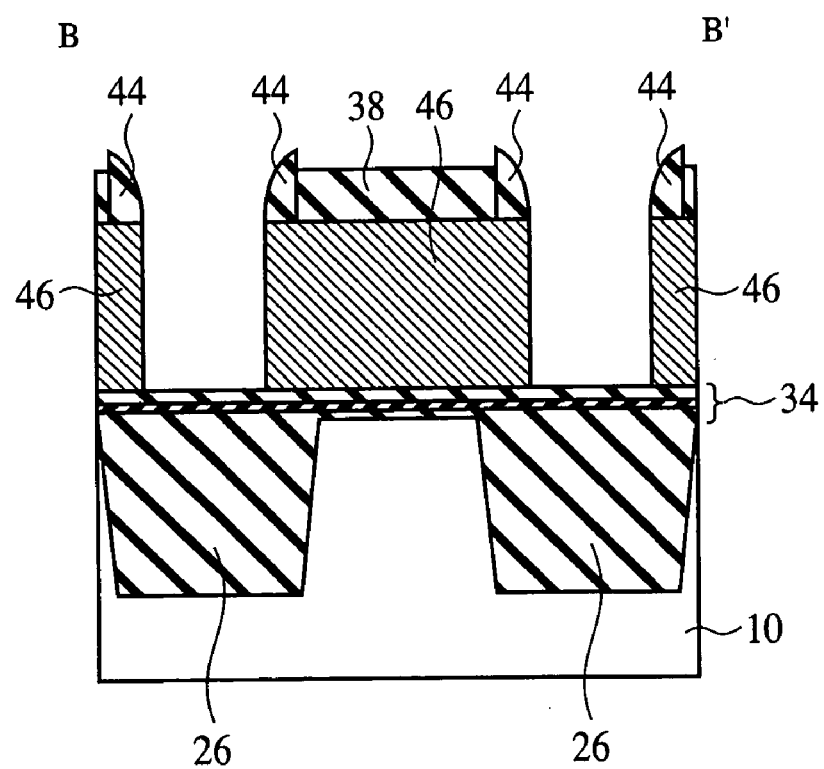

Next, with the hard mask film 38 and the spacer film 44 as the mask, ion implantation is performed to form by self alignment with the word lines 46 impurity diffused regions 48 to be the LDD regions in the silicon substrate 10 in the region where the hard mask film 38 and the spacer film 44 are not formed (FIGS. 24, 25A and 25B). Similarly, impurity diffused regions to be the pocket regions (not shown) may be formed.

Next, a silicon oxide film 50 and a silicon nitride film 52 are deposited on the entire surface by, e.g., CVD method, and these insulating films are etched back to form a spacer film 54 of the silicon oxide film 50 and the silicon nitride film 52 on the side walls of the word lines 46. At this time, the silicon oxide film 32 and the silicon nitride film 30 of the charge retaining insulating film 34 are removed, but the silicon oxide film 28 is left.

Figure 26:
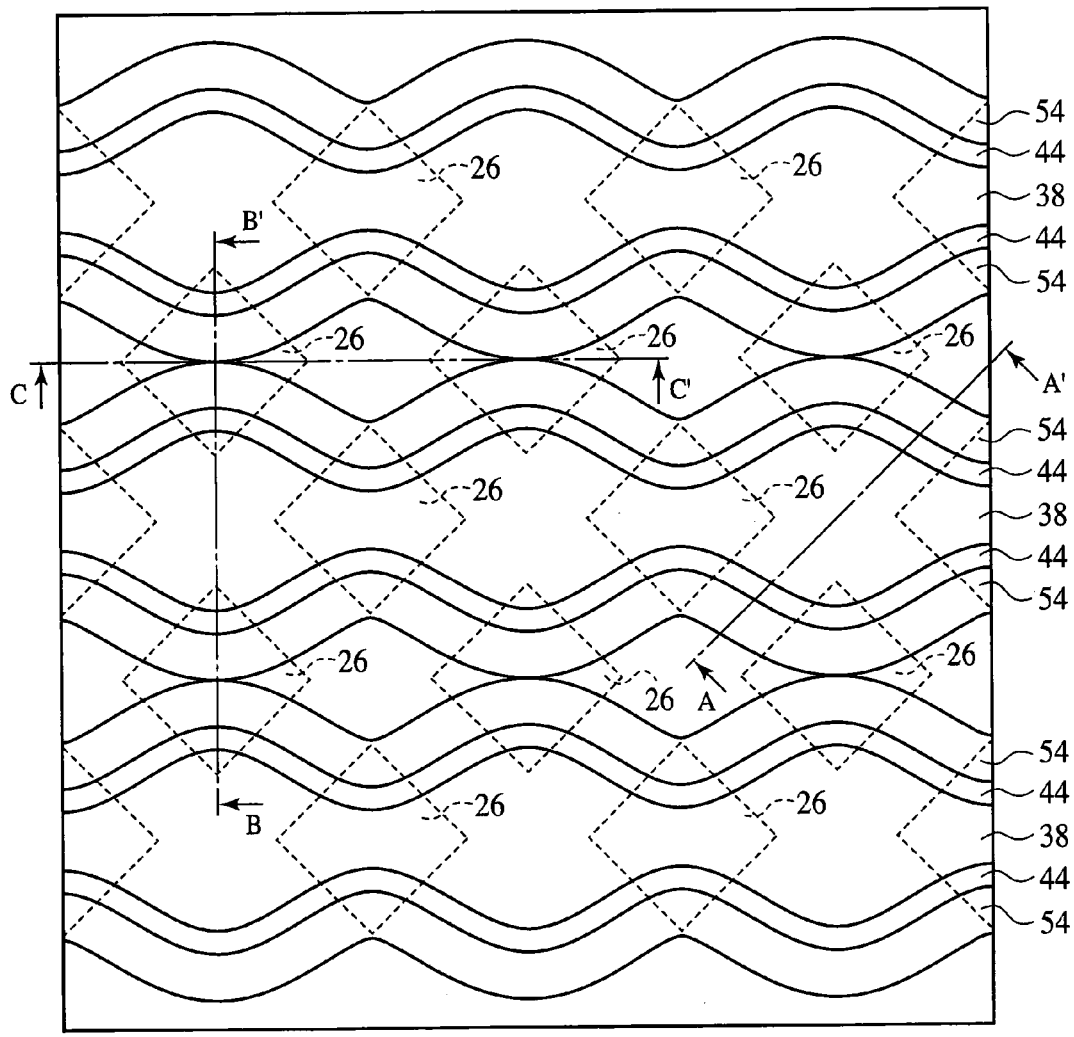
Figure 27A:
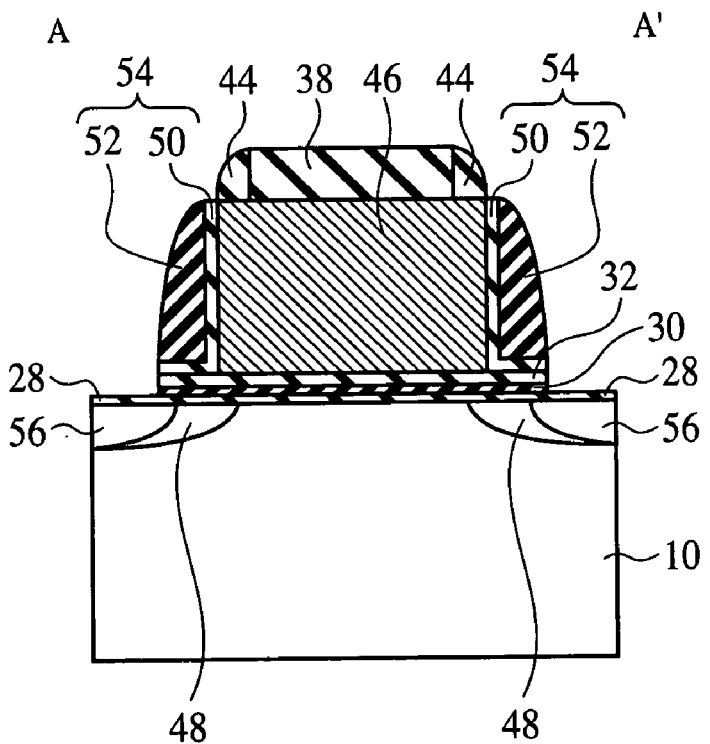
Figure 27B:
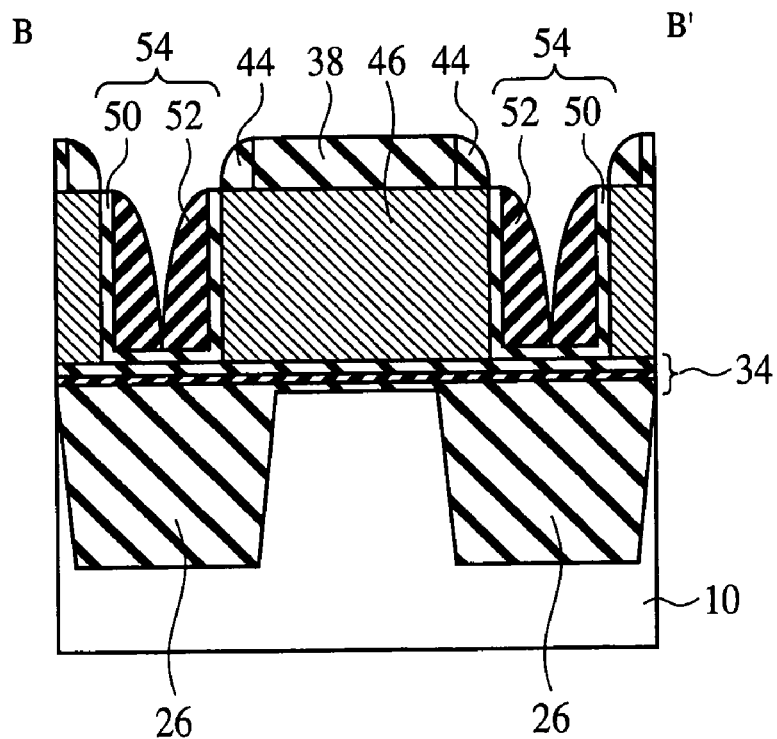

Then, ion implantation is performed with the hard mask film 38 and the spacer films 44, 54 as the mask to form by self alignment with the word lines impurity diffused regions 56 to be the source/drain regions in the silicon substrate 10 in the regions where the hard mask film 38 and the spacer films 44, 54 are not formed (FIGS. 26, 27A and 27B).

Then, the silicon oxide film 28 on the silicon substrate 10 and the hard mask film 38 and the spacer film 44 on the word lines 46 are removed by wet etching using a hydrofluoric acid-based aqueous solution.

Figure 28A:
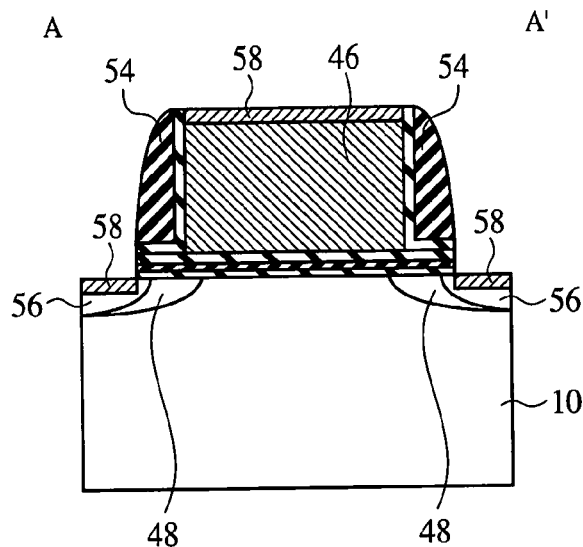
Figure 28B:
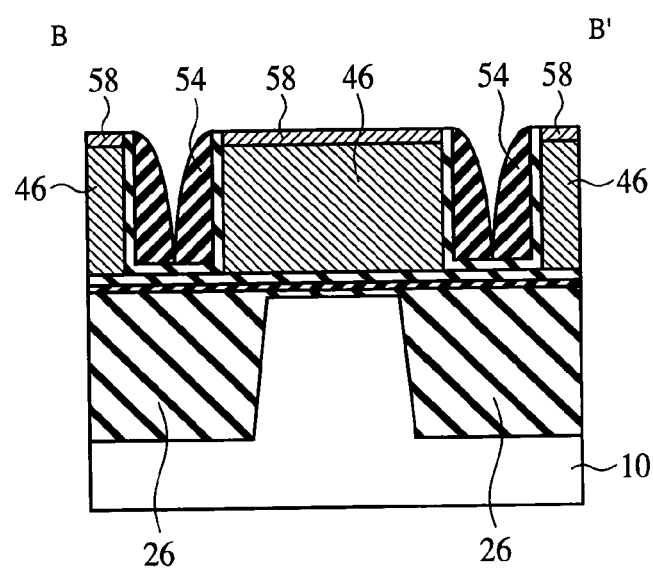
Figure 28C:
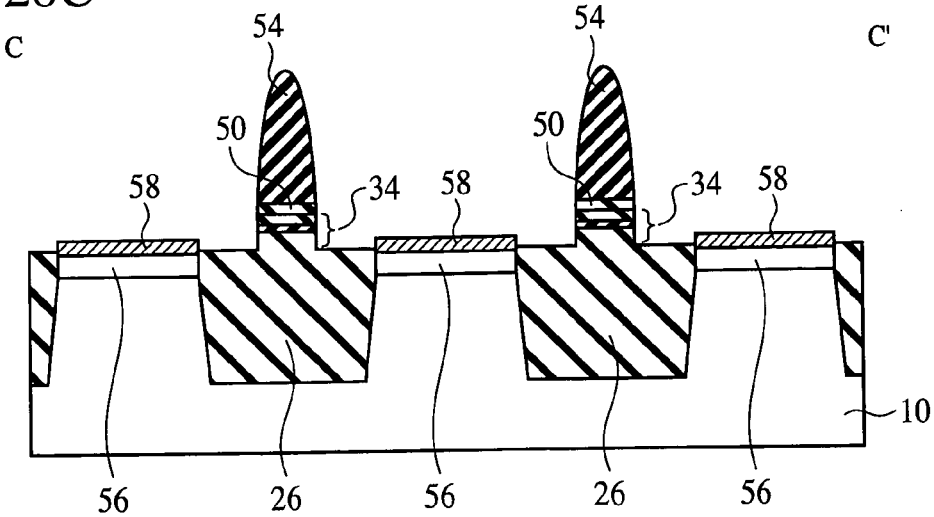

Then, by salicide process, a cobalt silicide film 58 is formed on the silicon substrate 10 and the word lines 46 which are exposed (FIGS. 28A, 28B and 28C). In place of cobalt silicide, another metal silicide, e.g., titanium silicide or nickel silicide may be used.

Then, by, e.g., CVD method, an etching stopper film 60 of, e.g., silicon nitride film, and an inter-layer insulating film 62 of, e.g., silicon oxide film are formed.

Figure 29:
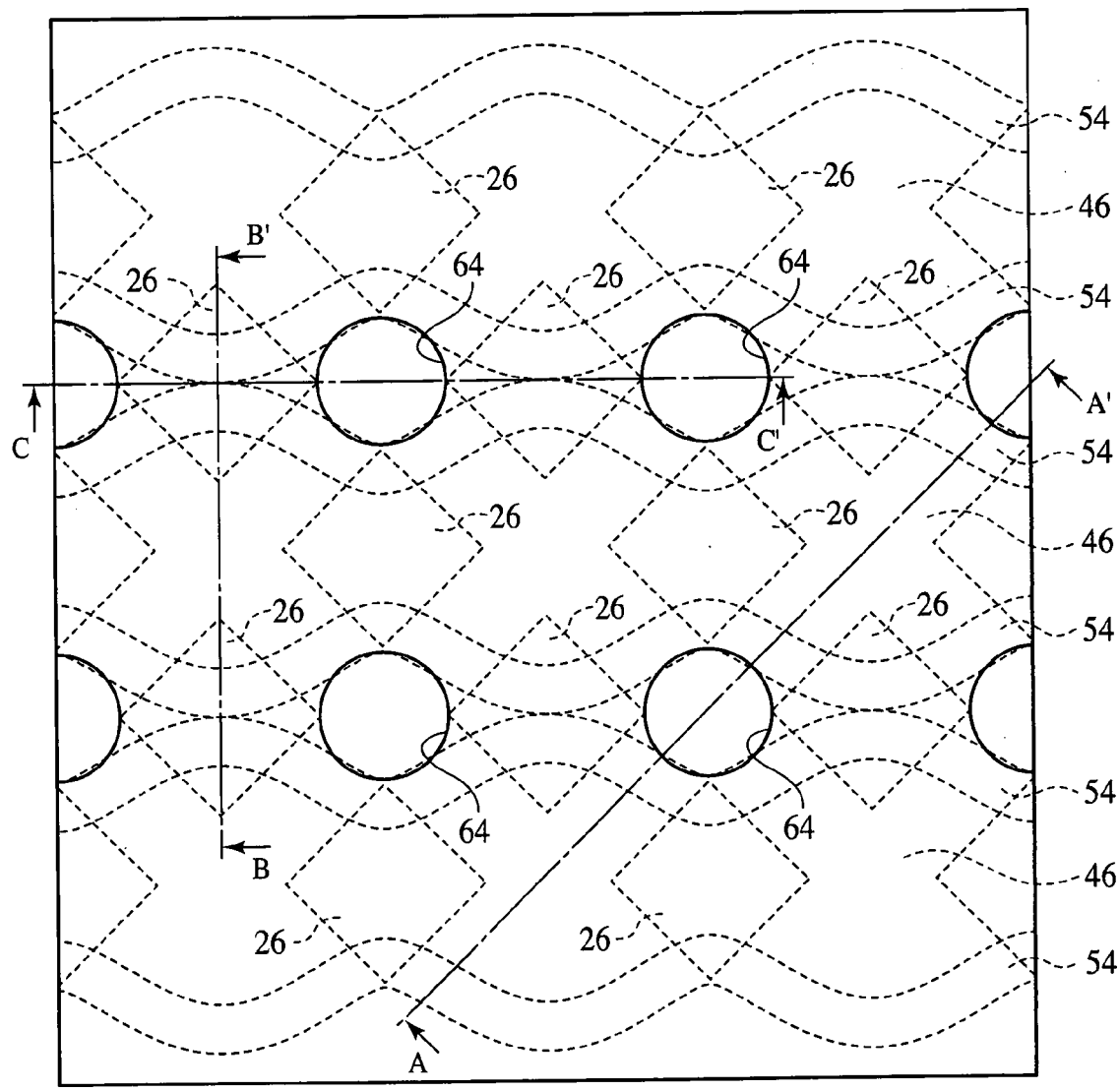
Figure 30A:
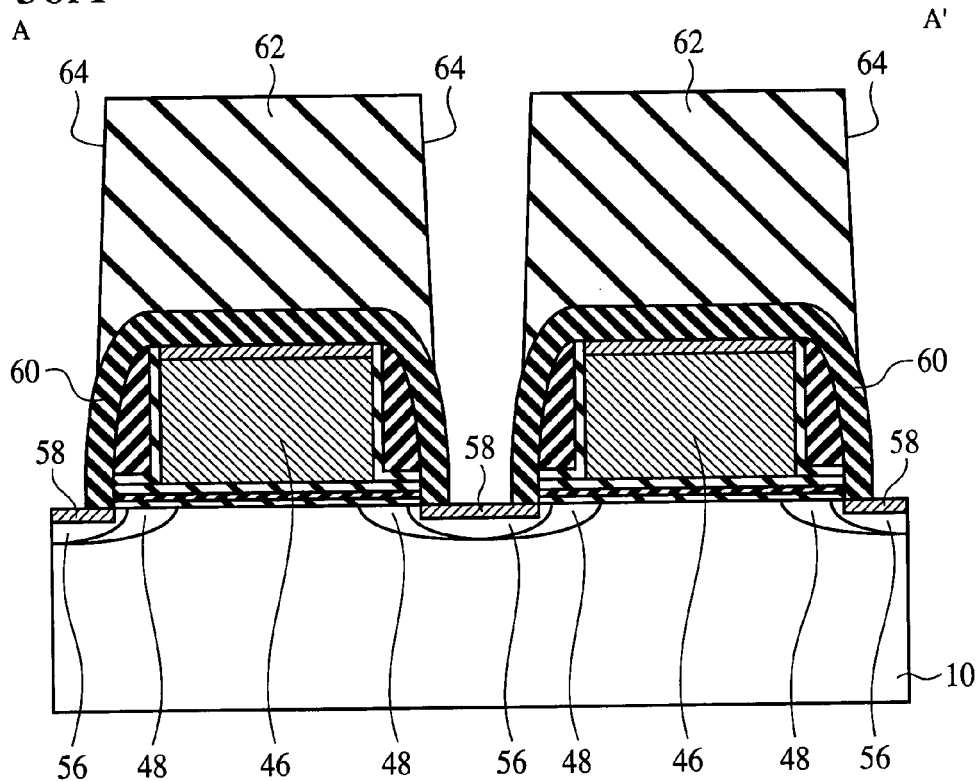
Figure 30B:
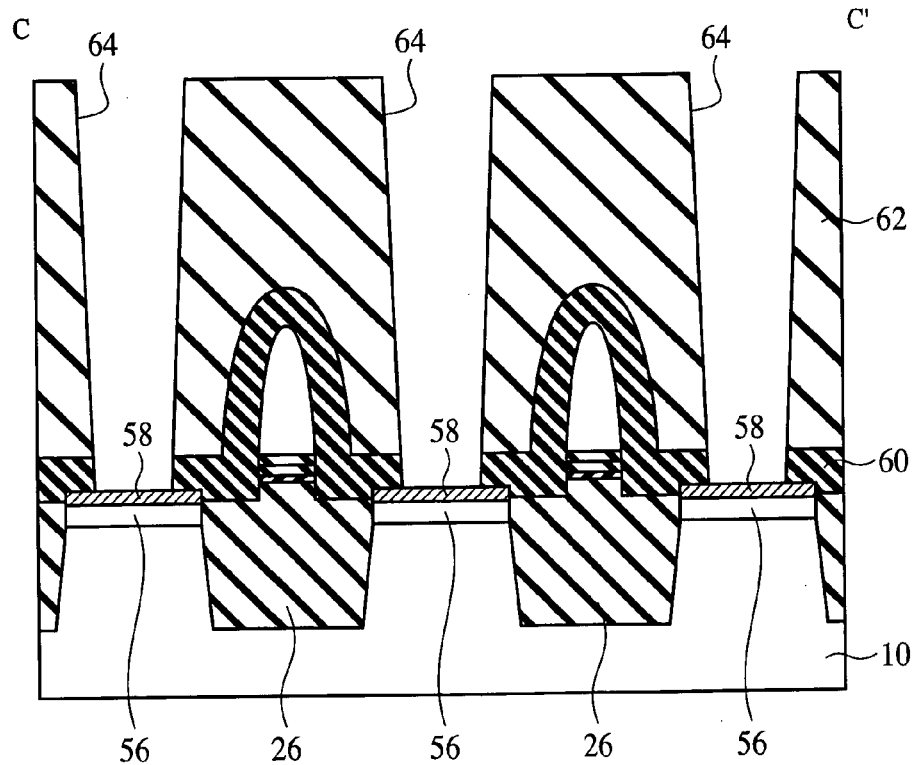

Next, by photolithography and dry etching, contact holes 64 are formed in the inter-layer insulating film 62 and the etching stopper film 60 down to the cobalt silicide film 58 (FIGS. 29, 30A and 30B).

The contact holes 64 are formed at an about 437 nm-square pitch, and the opening diameter of the contact holes 64 in the resist can be allowed to be up to about 160 nm. This design can be sufficiently opened with KrF photoresist.

When the alignment allowance for the lithography is considered, the contact holes 64 overlays the etching stopper film 60 formed on the spacer film 54, but the overlays are respectively corrected by the principle similar to the self aligned contact, which makes it possible to open the contact holes on the source/drain regions with high precision.

Then, a tungsten film, for example, is deposited on the entire surface by, e.g., CVD method. Thus, the tungsten film fills the contact holes 64 and extended on the inter-layer insulating film 62.

Figure 31:
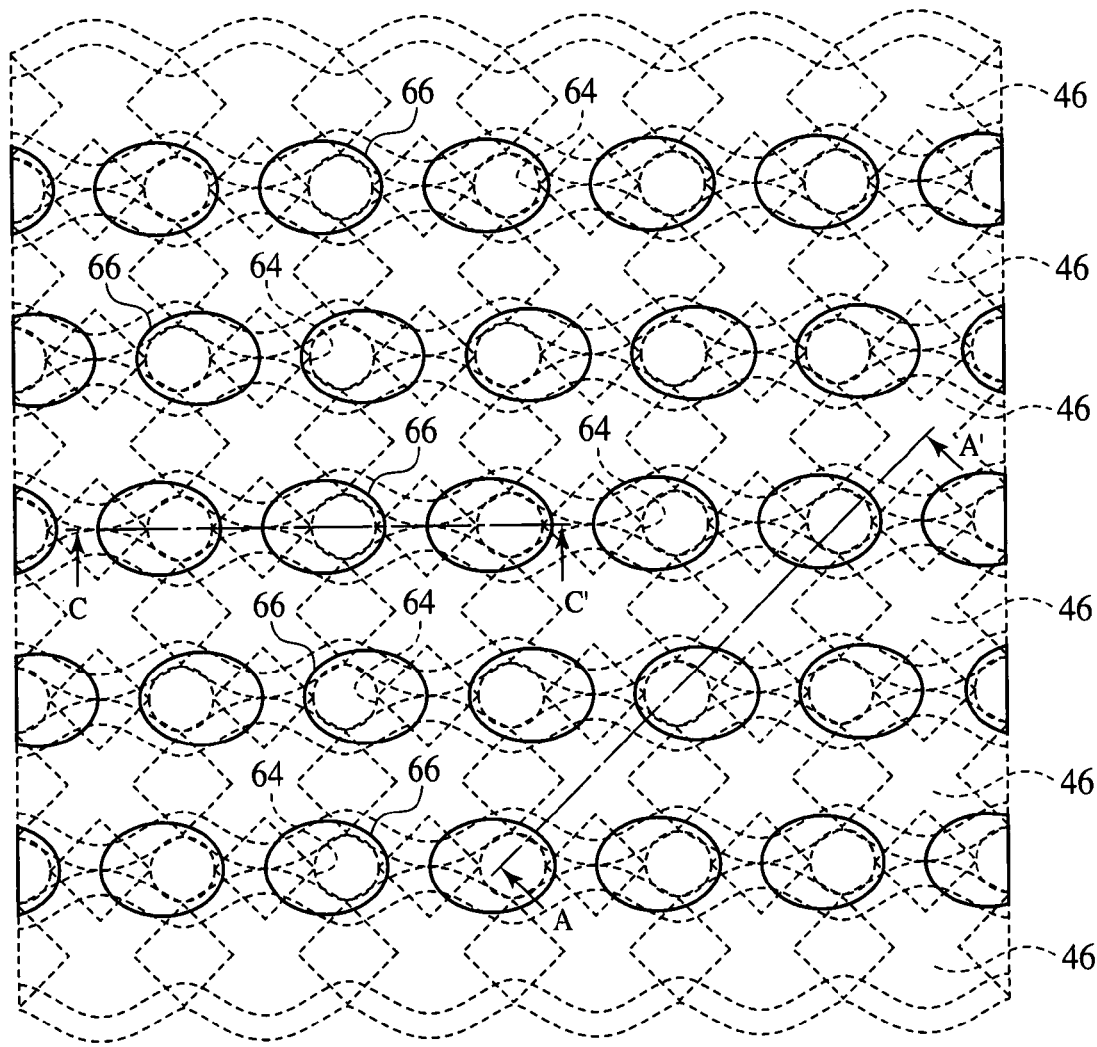
Figure 32A:
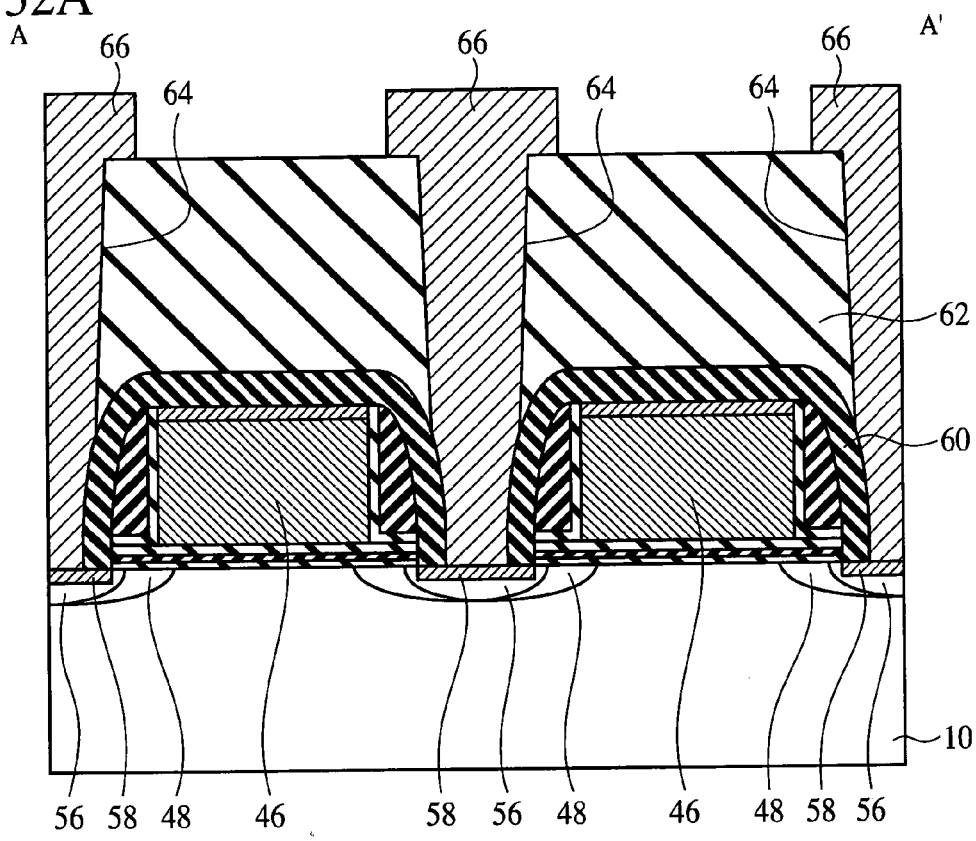
Figure 32B:
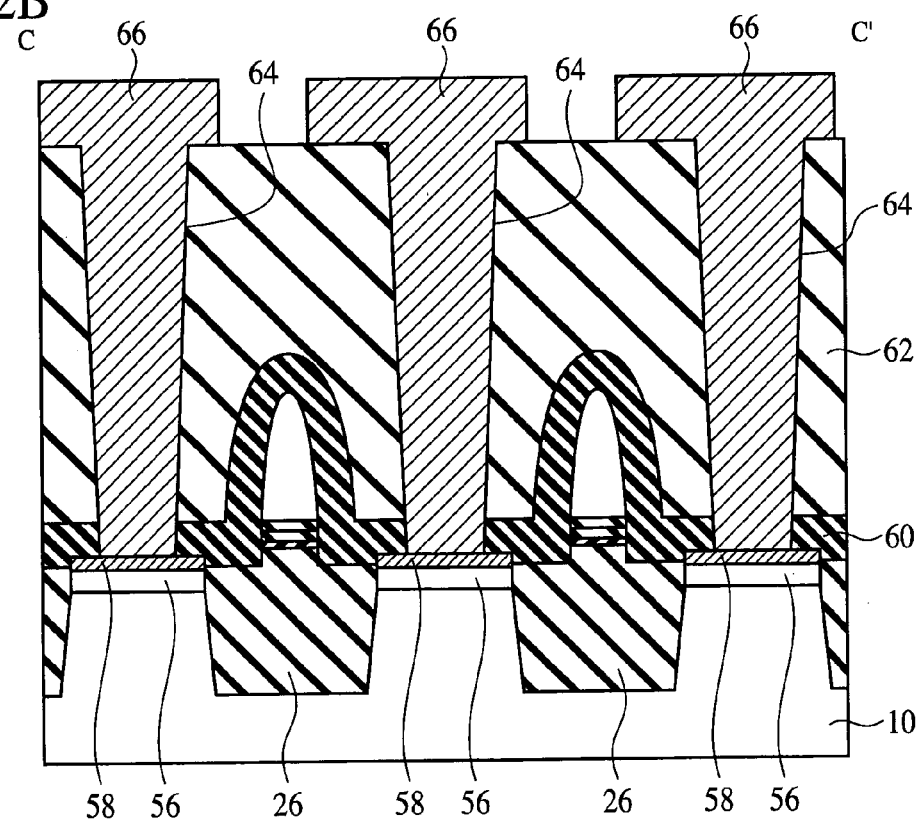

Then, the tungsten film extended on the inter-layer insulating film 62 is patterned by photolithography and dry etching to form lead electrodes 66 electrically connected to the impurity diffused regions 56 via the contact hole 64 (FIGS. 31, 32A and 32B).

Each lead electrode 66 has an isolated pattern elongated in the direction of extension of the control gate 46. The patterns of the lead electrodes 66, which are adjacent to each other with the control gate 46 therebetween, are extended oppositely as viewed at the position of the contact hole 64. This layout allows a layout having the largest process margin to be used in forming later the bit lines at a minimum pitch and interconnection width.

Next, by, e.g., CVD method, a silicon oxide film is deposited on the inter-layer insulating film 62 with the lead electrodes 66 formed on to form an inter-layer insulating film 68 of the silicon oxide film.

Next, contact holes 70 are formed in the inter-layer insulating film 68 down to the lead electrodes 66 by photolithography and dry etching. The contact holes 70 adjacent with the control gates 46 therebetween are laid out, offset oppositely as viewed at the positions of the contact holes 64. This layout of the contact holes 70 is corresponds to the above-described pattern of the lead electrodes 66.

Figure 33:
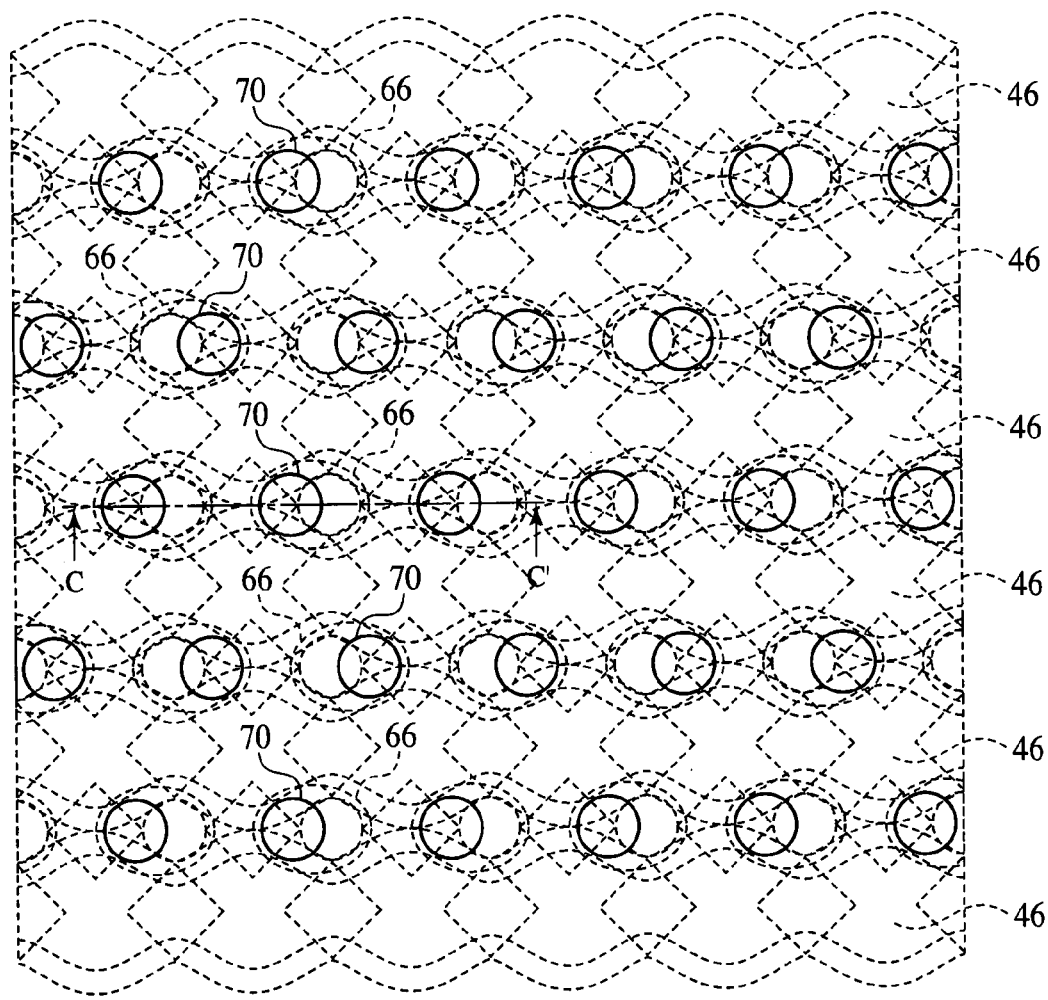
Figure 34:
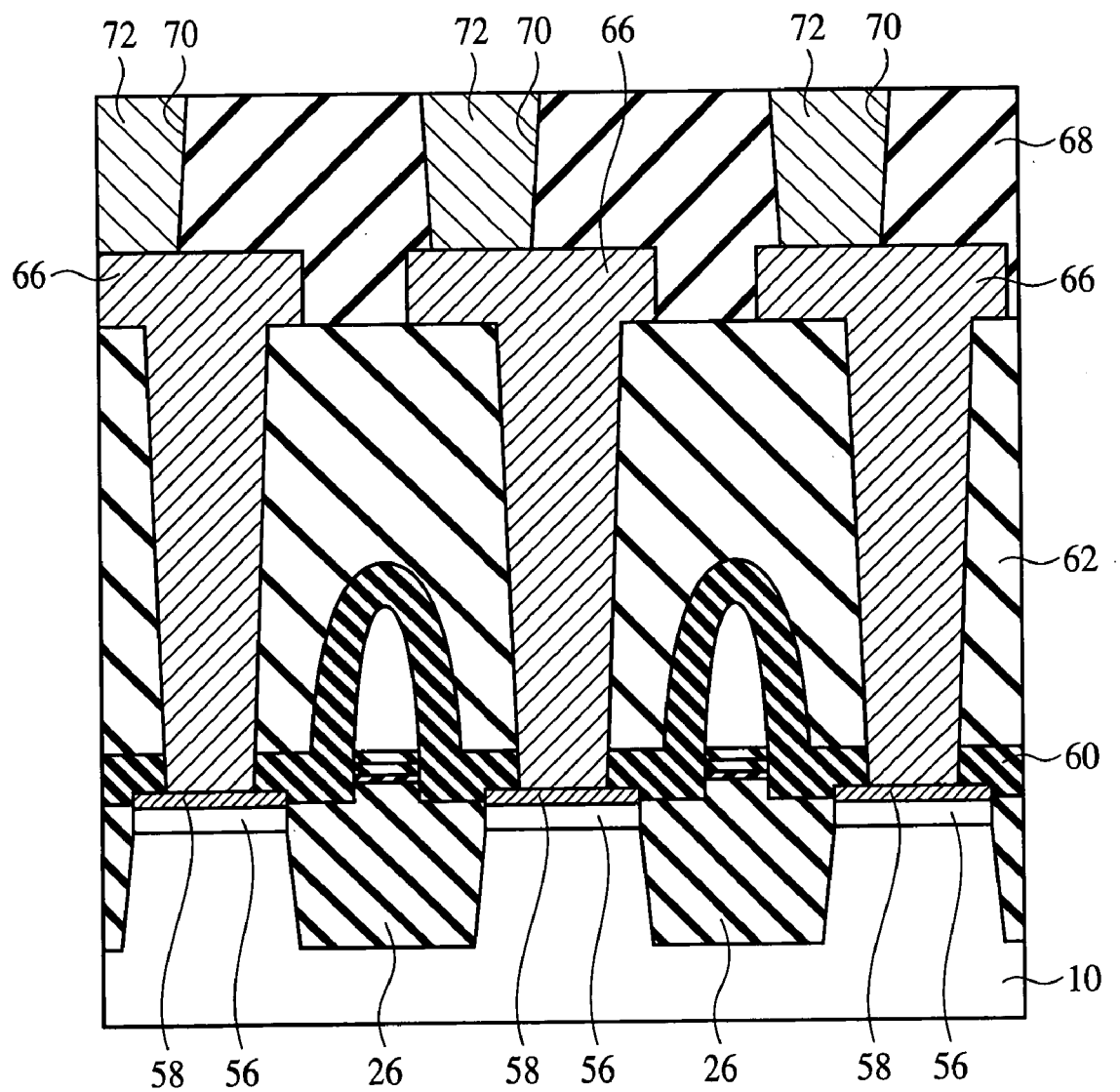

Then, a tungsten film, for example, is deposited by, e.g., CVD method, and the tungsten film on the inter-layer insulating film 68 is polished back by, e.g., CMP to form plugs 72 buried in the contact holes 70 (FIGS. 33 and 34).

Next, on the inter-layer insulating film with the plugs 72 buried in, a silicon oxide film is deposited by, e.g., CVD method to form an inter-layer insulating film 74 of the silicon oxide film.

Next, antireflection film is formed on the inter-layer insulating film 74.

Then, by photolithography and dry etching, interconnection trenches 76 of, e.g., a 109 nm-width are formed in the inter-layer insulating film 74 at, e.g., a 218 nm-pitch. At this time, the patterning for the memory cell array and the patterning for the peripheral circuit are independently performed, whereby the KrF photoresist can be resolved.

Figure 35:
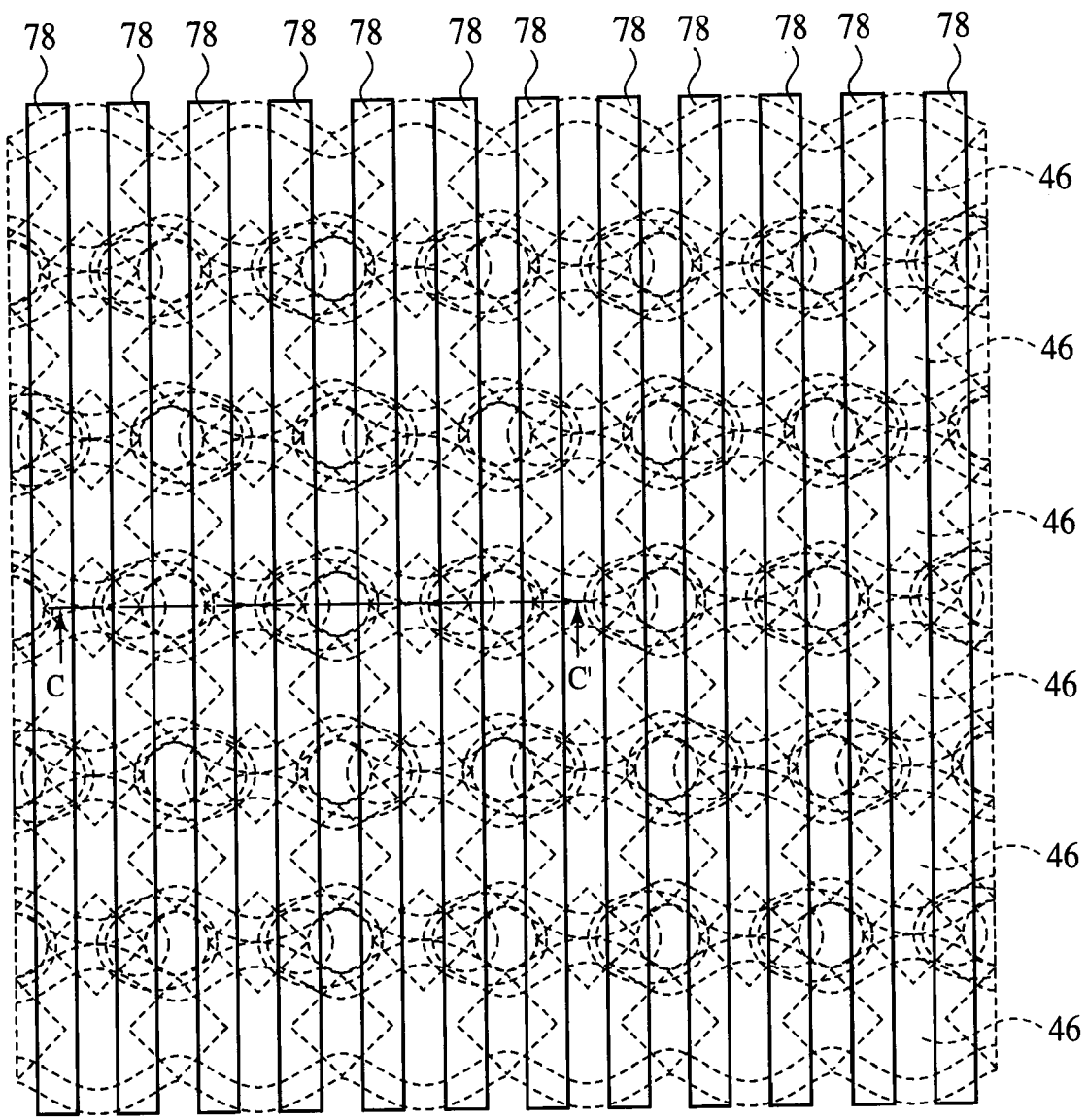
Figure 36:
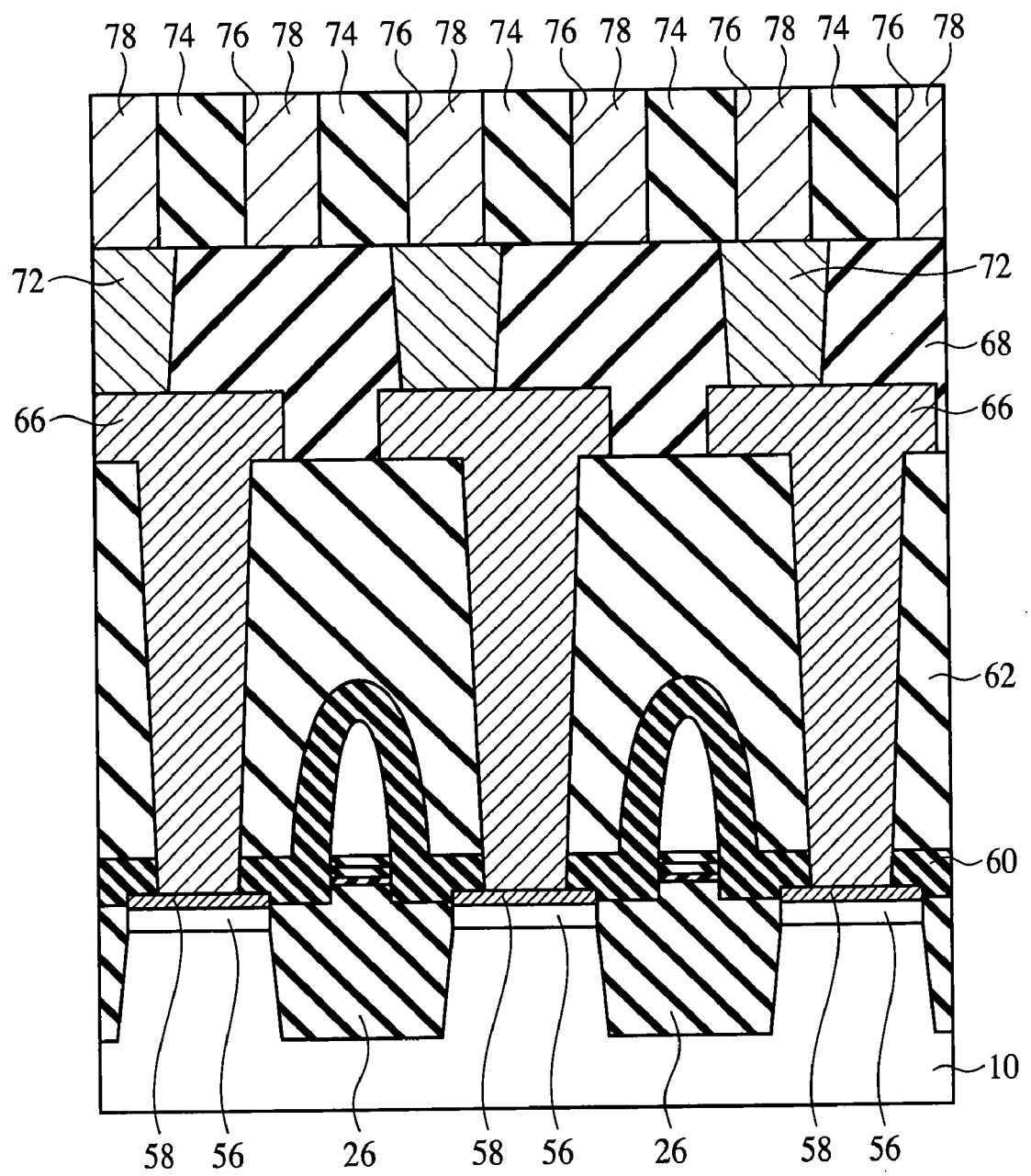

Next, a tungsten film, for example, is deposited by, e.g., CVD, and then the tungsten film on the inter-layer insulating film 74 is polished back by, e.g., CMP method to form the bit lines 78 buried in the interconnection trenches 76 (FIGS. 35 and 36).

Then, a multi-level metal interconnection layer, etc. are further formed as required, and the nonvolatile semiconductor memory device according to the present embodiment is completed.

As described above, according to the present embodiment, one channel region is common between 2 memory cell transistors, whereby 1 unit memory cell can store charges for 4 bits, and the integration can be improved. Such cell structure can much reduce the cell area per a unit bit, whereby the cell area increase by providing bit line contacts for the respective source/drain regions can be generally suppressed. Accordingly, the cell area increase can be suppressed while the bit lines can be formed of a metal interconnection layer, whereby high speed operation can be realized.

[Modified Embodiments]

The present invention is not limited to the above-described embodiment and can cover other various modifications.

For example, in the above-described embodiment, 1 channel region is common between 2 memory cell transistors. However, 1 channel region may be common among 3 or more memory cell transistors.

Figure 37:
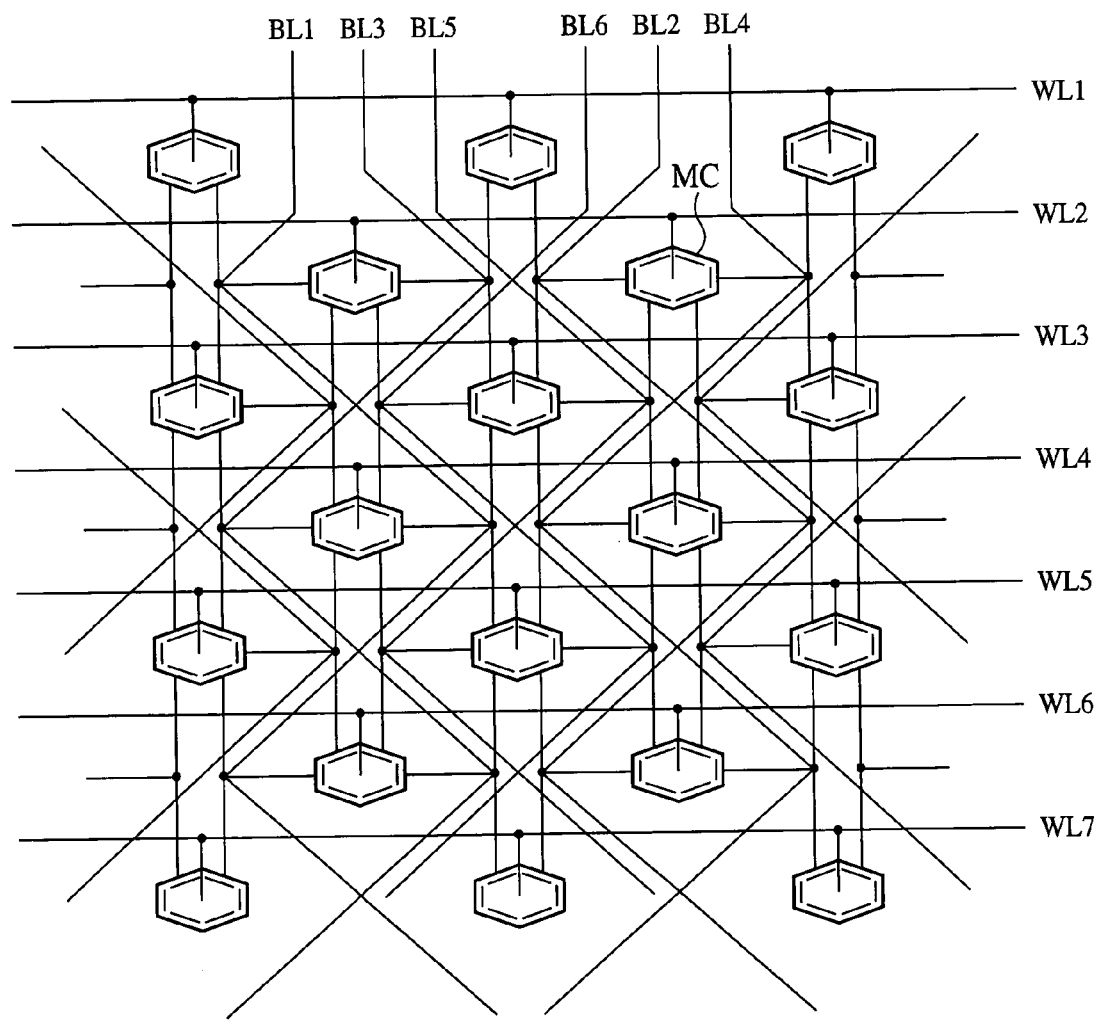
FIG. 37 is a circuit diagram of the nonvolatile semiconductor memory device according to one modification of the embodiment of the present invention, which shows a structure thereof.

FIG. 37 is a circuit diagram of the nonvolatile semiconductor memory device having 1 channel region shared by 3 memory cell transistors. In FIG. 37, the hexagonal parts are memory cells MC. One word line WL and 6 bit lines BL are connected to each memory cell MC. When the memory cell MC at the center is noted, the word line WL3 and the bit lines BL1, BL2, BL3, BL4, BL5, BL6 are connected to the memory cell MC.

When a first memory cell transistor is operated, the word line WL3 AND the bit lines BL1, BL2 are used. With a prescribed voltage applied to the word line WL3, a prescribed voltage is applied between the bit lines BL1, BL2 to flow current, whereby charges can be stored in the charge retaining insulating film. The direction of the voltage applied to the bit lines BL1, BL2 is suitably changed, whereby information can be stored independently in the charge retaining insulating film on the side of the source/drain region connected to the bit line BL1 and the charge retaining insulating film on the side of the source/drain region connected to the bit line BL2.

When a second memory cell transistor is operated, the word line WL3 and the bit lines BL3, BL4 are used. With a prescribed voltage applied to the word line WL3, a prescribed voltage is applied between the bit lines BL3, BL4 to flow current, whereby charges can be stored in the charge retaining insulating film. The direction of the voltage applied to the bit lines BL3, BL4 is suitably changed, whereby information can be stored independently in the charge retaining insulating film on the side of the source/drain region connected to the bit line BL3 and in the charge retaining insulating film on the side of the source/drain region connected to the bit line BL4.

When a third memory cell transistor is operated, the word line WL3 and the bit lines BL5, BL6 are used. With a prescribed voltage applied to the word line WL3, a prescribed voltage is applied between the bit lines BL5, BL6 to flow current, whereby charges can be stored in the charge retaining insulating film. The direction of the voltage applied to the bit lines BL5, BL6 is suitably changed, whereby information can be stored independently in the charge retaining insulating film on the side of the source/drain region connected to the bit line BL5 and in the charge retaining insulating film on the side of the source/drain region connected to the bit line BL6.

Figure 38:
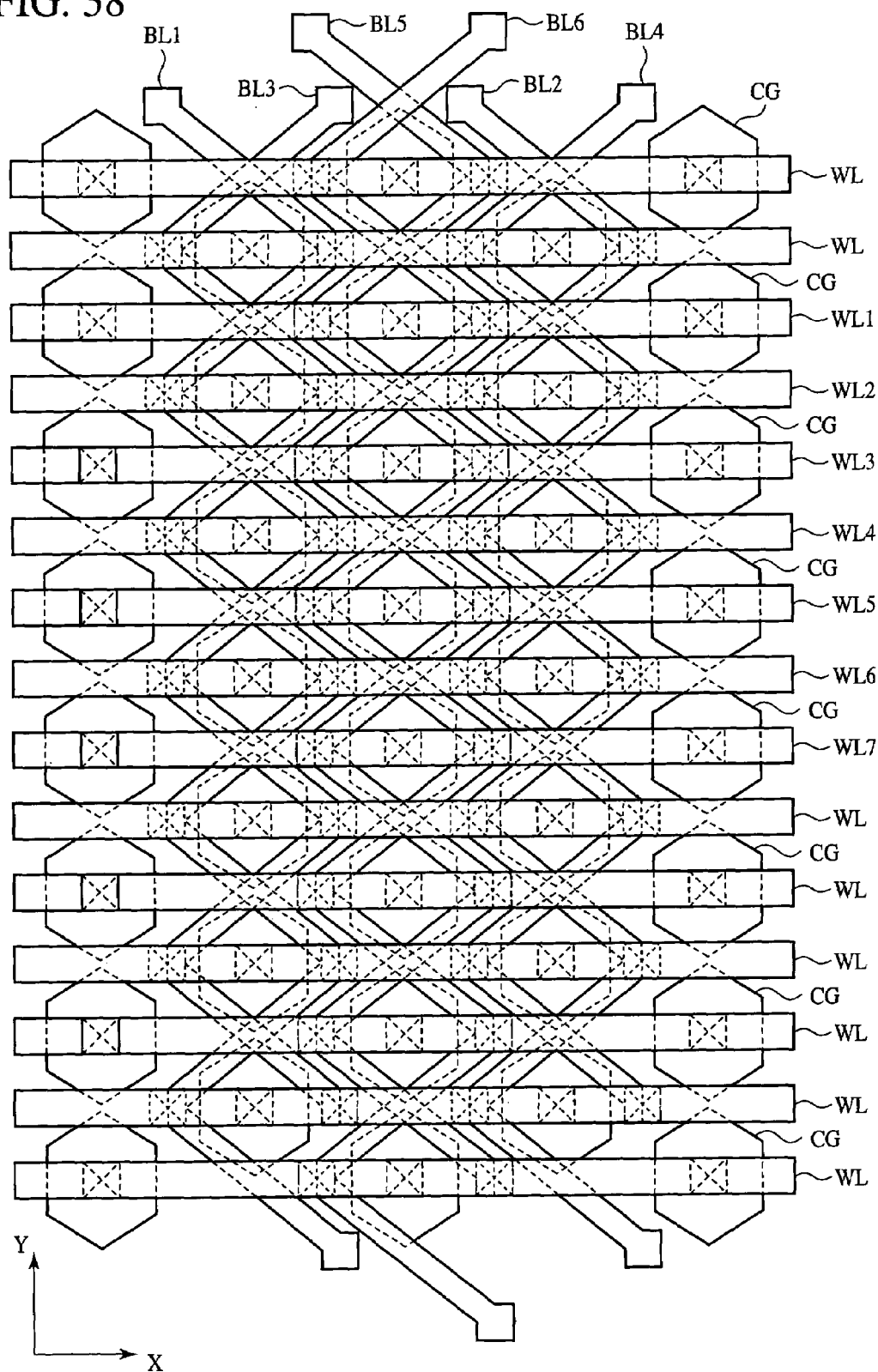
FIG. 38 is a plan view of the nonvolatile semiconductor memory device according to one modification of the embodiment of the present invention, which shows a structure thereof.

FIG. 38 is a plan view of one example of the layout for realizing the circuit diagram of FIG. 37.

Contacts to the source/drain regions are provided, opposed to the respective sides of each hexagonal control gate CG. The bit lines BL1, BL2, BL3, BL4, BL5, BL6 are connected respectively to these 6 contacts. The bit lines BL1, BL2, BL3, BL4, BL5, BL6 are extended zigzag between the control gates CG arranged in the Y-direction. The word lines WL commonly connecting the control gates CG are connected to the control gates CG arranged in the X-direction.

The respective layers are thus laid out, whereby 1 channel region can be common among 3 memory cell transistors.

In the above-described embodiment, the word line 46 functioning also as the control gate 46a is formed of 1 conducting layer. However, as exemplified in the modified embodiment of FIG. 38, discrete control gates formed on the channel regions may be commonly connected by an upper interconnection layer. Otherwise, it is possible that adjacent control gates are electrically interconnected with each other by a local interconnection, and the interconnection of the control gates by the local interconnection is repeated to thereby form the word lines. The local interconnections may be formed of a conductive material, such as polycrystalline silicon, amorphous silicon, silicide, polycide, titanium alloy, tungsten, aluminum alloy or others.

In the above-described embodiment, the bit lines 78 are formed by so-called damascene method. However, a conducting film is deposited, and the conducting film is patterned to thereby form the bit lines 78. The bit lines 78 can be formed of a conductive material, such as tungsten, aluminum alloy, copper or others.

In the above-described embodiment, the memory cell transistors have the LDD structure. However, the source/drain structure of the memory cell transistors is not limited to the LDD structure, and may have pocket regions.

In the above-described embodiment, the charge retaining insulating film is formed of ONO film but is not essentially formed of ONO film. The charge retaining insulating film may have, in place of ONO film, the 3 layer structure of silicon oxide film/alumina film/silicon oxide film, the 3 layer structure of silicon oxide film/tantalum oxide film/silicon oxide film, the 3 layer structure of silicon oxide film/titanium strontium oxide film/silicon oxide film, the 3 layer structure of silicon oxide film/silicon nitride film/alumina film, the 3 layer structure of silicon oxide film/nanocyrstal/silicon oxide film, or others.

What is claimed is:

1. A nonvolatile semiconductor memory device comprising:
    a channel region formed in a semiconductor substrate;
    a gate electrode formed over the channel region with a charge retaining insulating film formed therebetween;
    a first pair of source/drain regions formed in the semiconductor substrate and arranged in a first direction with the channel region formed therebetween;
    a second pair of source/drain regions formed in the semiconductor substrate and arranged in a second direction intersecting the first direction with the channel region formed therebetween, the second pair of source/drain regions having the same conductivity type as the first pair of source/drain regions; and
    device isolation regions formed of an insulating material and defining a region for the channel region, the first pair of source/drain regions and the second pair of source/drain regions,
    the channel region and the gate electrode being common between a first memory cell transistor including the first pair of source/drain regions and a second memory cell transistor including the second pair of source/drain regions.

2. A nonvolatile semiconductor memory device comprising:
    an active region defined in a lattice pattern by a plurality of device isolation regions formed of an insulating material and formed in a semiconductor substrate;
    a plurality of channel regions provided at every other lattice point of the lattice pattern of the active region;
    a plurality of source/drain regions formed at every other lattice point which is other than the lattice points where the channel regions are formed, the plurality of source/drain regions being formed of the same conductivity type; and
    a plurality of gate electrodes formed respectively over said plurality of channel regions with a charge retaining insulating film formed therebetween,
    at each of the lattice points where the channel regions are formed, a first memory cell transistor including a pair of said source/drain regions is arranged in a first direction with the channel region formed therebetween, and a second memory cell transistor including a pair of said source/drain regions is arranged in a second direction intersecting the first direction with the channel region formed therebetween.

3. A nonvolatile semiconductor memory device according to claim 2, wherein
    a total overlay between the gate electrode and the device isolation region in a third direction which is one diagonal direction of the lattice pattern is defined by a minimum overlay in the third direction necessary between the gate electrode and the device isolation region, a fluctuation of a size of the device isolation region estimated in the third direction, and a fluctuation of a size of the gate electrode estimated in the third direction, and
    a total overlay between the gate electrode and the device isolation region in a fourth direction which is the other diagonal direction of the lattice pattern is defined by a minimum overlay in the fourth direction necessary between the gate electrode and the device isolation region, a fluctuation of a size of the device isolation region estimated in the fourth direction, and a fluctuation of a size the gate electrode estimated in the fourth direction.

4. A nonvolatile semiconductor memory device according to claim 3, wherein
    the gate electrode is formed based on a rhombic basic pattern, and
    respective sides of the basic pattern are laid out so that a required channel length is ensured; and a value of an overlay between the gate electrode and the device isolation region in the third direction is not lower than a value of the total overlay in the third direction, and a value of an overlay between the gate electrode and the device isolation region in the fourth direction is not below a value of the total overlay in the fourth direction.

5. A nonvolatile semiconductor memory device according to claim 4, wherein the gate electrode has a pattern of a hexagon prepared by removing the corners of the basic pattern in the fourth direction.

6. A nonvolatile semiconductor memory device according to claim 4, wherein when a channel length is L; a channel width is W; an angle between the first direction and the third direction is θ; a length of a diagonal of the channel region in the third direction is $D_{LC}$; a length of a diagonal of the channel region in the fourth direction is $D_{SC}$; a length of a diagonal of the gate electrode in the third direction is $D_{LW}$; a length of a diagonal of the gate electrode in the fourth direction is $D_{SW}$; the total overlay between the gate electrode and the device isolation region in the third direction is $WL_{OVX}$; and the total overlay between the gate electrode and the device isolation region in the fourth direction is $WL_{OVY}$, the respective sides of the basic pattern of the gate electrode are so set that the length $D_{LW}$ of the diagonal in the third direction and the length $D_{SW}$ of the diagonal in the fourth direction are expressed by Expression A and Expression B recited below $$D_{LW} = \frac{D_{LC} + 2 \cdot WL_{OVX} - L \cdot \cos\theta}{L \cdot \sin\theta - 2 \cdot WL_{OVY}} \cdot D_{SW} \quad\quad A$$

$$D_{LW} = \frac{2 \cdot WL_{OVX} - L \cdot \cos\theta}{L \cdot \sin\theta - (D_{SC} + 2 \cdot WL_{OVY})} \cdot D_{SW}. \quad\quad B$$

7. A nonvolatile semiconductor memory device according to claim 4, wherein a length of one side of the device isolation region is defined by a value of the total overlay between the gate electrode and the device isolation region in the third direction and a value of the total overlay between the gate electrode and the device isolation region in the fourth direction.

8. A nonvolatile semiconductor memory device according to claim 7, wherein when an angle between the first direction and the third direction is θ; a length of a diagonal of the channel region in the third direction is $D_{LC}$; a length of a diagonal of the channel region in the fourth direction is $D_{SC}$; a length of a diagonal of the gate electrode in the third direction is $D_{LW}$; a length of a diagonal of the gate electrode in the fourth direction is $D_{SW}$; the total overlay between the gate electrode and the device isolation region in the third direction is $WL_{OVX}$; and the total overlay between the gate electrode and the device isolation region in the fourth direction is $WL_{OVY}$, a minimum value $W_{ISOX}$ of one side of the device isolation region in the third direction and a minimum value $W_{ISOY}$ soy of other side of the device isolation region in the fourth direction are defined by $$W_{ISOX} = \frac{D_{SW} \cdot D_{SC}(D_{LW} - D_{LC})}{2 \cdot \sin\theta \cdot (D_{SC} \cdot D_{LW} + D_{SW} \cdot D_{LC})} + \sqrt{WL_{OVX}^2 + WL_{OVY}^2}$$

$$W_{ISOY} = \frac{D_{LW} \cdot D_{LC}(D_{SW} - D_{SC})}{2 \cdot \cos\theta \cdot (D_{SC} \cdot D_{LW} + D_{SW} \cdot D_{LC})} + \sqrt{WL_{OVX}^2 + WL_{OVY}^2}.$$

9. A nonvolatile semiconductor memory device according to claim 2, further comprising:

a plurality of word lines electrically connecting the gate electrodes arranged in a third direction which is one diagonal direction of the lattice pattern; and a plurality of bit lines electrically connecting the source/drain regions arranged in a fourth direction which is the other diagonal direction of the lattice pattern.

* * * * *